US008723760B2

(12) United States Patent
Osame et al.

(10) Patent No.: US 8,723,760 B2
(45) Date of Patent: *May 13, 2014

(54) LIGHT-EMITTING DEVICE

(75) Inventors: Mitsuaki Osame, Kanagawa (JP); Aya Anzai, Kanagawa (JP); Jun Koyama, Kanagawa (JP); Makoto Udagawa, Kanagawa (JP); Masahiko Hayakawa, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 731 days.

This patent is subject to a terminal disclaimer.

(21) Appl. No.: 11/832,307

(22) Filed: Aug. 1, 2007

(65) Prior Publication Data

US 2008/0170005 A1 Jul. 17, 2008

Related U.S. Application Data

(60) Continuation of application No. 11/147,317, filed on Jun. 8, 2005, now Pat. No. 7,262,556, which is a division of application No. 10/346,194, filed on Jan. 17, 2003, now Pat. No. 6,909,240.

(30) Foreign Application Priority Data

Jan. 18, 2002 (JP) .................................. 2002-010848
Feb. 1, 2002 (JP) .................................. 2002-025065

(51) Int. Cl.
*G09G 3/30* (2006.01)

(52) U.S. Cl.
USPC .......................................................... 345/76

(58) Field of Classification Search
USPC .......................................................... 345/76
See application file for complete search history.

(56) References Cited

U.S. PATENT DOCUMENTS 5,159,476 A 10/1992 Hayashi
(Continued)

FOREIGN PATENT DOCUMENTS

CN 1138181 12/1996
(Continued)

OTHER PUBLICATIONS

Office Action (Korean Patent Application No. 2003-0003483) dated Apr. 6, 2009 with English translation.

(Continued)

*Primary Examiner* — Quan-Zhen Wang
*Assistant Examiner* — Nelson D Runkle, III
(74) *Attorney, Agent, or Firm* — Fish & Richardson P.C.

(57) ABSTRACT

A-light-emitting device which realizes a high aperture ratio and in which the quality of image is little affected by the variation in the characteristics of TFTs. A large holding capacitor Cs is not provided in the pixel portion but, instead, the channel length and the channel width of the driving TFTs are increased, and the channel capacitance is utilized as Cs. The channel length is selected to be very larger than the channel width to improve current characteristics in the saturated region, and a high $V_{GS}$ is applied to the driving TFTs to obtain a desired drain current. Therefore, the drain currents of the driving TFTs are little affected by the variation in the threshold voltage. In laying out the pixels, further, wiring is arranged under the partitioning wall and the driving TFTs are arranged under the wiring in order to avoid a decrease in the aperture ratio despite of an increase in the size of the driving TFT. In the case of the 3-transistor pixels, the switching TFT and the erasing TFT are linearly arranged to further increase the aperture ratio.

19 Claims, 22 Drawing Sheets

(56) References Cited

U.S. PATENT DOCUMENTS

| | | | |
|---|---|---|---|
| 5,650,636 A | 7/1997 | Takemura | |
| 5,729,308 A | 3/1998 | Yamazaki et al. | |
| 5,763,899 A | 6/1998 | Yamazaki et al. | |
| 5,814,834 A | 9/1998 | Yamazaki | |
| 5,895,935 A | 4/1999 | Yamazaki | |
| 6,023,074 A | 2/2000 | Zhang | |
| 6,088,070 A | 7/2000 | Ohtani et al. | |
| 6,166,397 A | 12/2000 | Yamazaki | |
| 6,201,585 B1* | 3/2001 | Takano et al. | 349/42 |
| 6,204,610 B1* | 3/2001 | Komiya | 315/169.3 |
| 6,246,180 B1 | 6/2001 | Nishigaki | |
| 6,259,117 B1 | 7/2001 | Takemura | |
| 6,274,887 B1 | 8/2001 | Yamazaki | |
| 6,277,679 B1 | 8/2001 | Ohtani | |
| 6,297,518 B1 | 10/2001 | Zhang | |
| 6,362,798 B1 | 3/2002 | Kimura et al. | |
| 6,380,672 B1 | 4/2002 | Yudasaka | |
| 6,384,427 B1 | 5/2002 | Yamazaki | |
| 6,417,896 B1 | 7/2002 | Yamazaki et al. | |
| 6,445,005 B1 | 9/2002 | Yamazaki | |
| 6,477,843 B2 | 11/2002 | Schroeder | |
| 6,528,950 B2 | 3/2003 | Kimura | |
| 6,545,291 B1 | 4/2003 | Amundson | |
| 6,580,094 B1 | 6/2003 | Yamazaki et al. | |
| 6,583,775 B1* | 6/2003 | Sekiya et al. | 345/76 |
| 6,583,776 B2 | 6/2003 | Yamazaki et al. | |
| 6,593,691 B2 | 7/2003 | Nishi et al. | |
| 6,628,349 B1 | 9/2003 | Takei | |
| 6,642,651 B2 | 11/2003 | Yudasaka | |
| 6,670,637 B2 | 12/2003 | Yamazaki | |
| 6,690,033 B2 | 2/2004 | Yamazaki | |
| 6,714,178 B2 | 3/2004 | Koyama | |
| 6,750,473 B2 | 6/2004 | Amundson | |
| 6,774,574 B1 | 8/2004 | Koyama | |
| 6,777,887 B2 | 8/2004 | Koyama | |
| 6,781,155 B1 | 8/2004 | Yamada | |
| 6,809,343 B2 | 10/2004 | Yamazaki et al. | |
| 6,847,341 B2 | 1/2005 | Kimura | |
| 6,876,346 B2* | 4/2005 | Anzai et al. | 345/82 |
| 6,885,148 B2 | 4/2005 | Yudasaka | |
| 6,909,240 B2 | 6/2005 | Osame | |
| 6,914,642 B2 | 7/2005 | Yamazaki et al. | |
| 7,053,890 B2 | 5/2006 | Inukai | |
| 7,071,911 B2 | 7/2006 | Inukai | |
| 7,129,917 B2 | 10/2006 | Yamazaki et al. | |
| 7,173,584 B2 | 2/2007 | Kimura et al. | |
| 7,262,556 B2 | 8/2007 | Osame et al. | |
| 7,279,752 B2 | 10/2007 | Yamazaki et al. | |
| 7,358,531 B2 | 4/2008 | Koyama | |
| 7,397,518 B1 | 7/2008 | Ohtani et al. | |
| 7,473,928 B1 | 1/2009 | Yamazaki et al. | |
| 7,521,722 B2 | 4/2009 | Yamazaki et al. | |
| 7,525,165 B2 | 4/2009 | Yamazaki et al. | |
| 7,548,023 B2 | 6/2009 | Yamazaki et al. | |
| 7,567,227 B2 | 7/2009 | Kimura | |
| 7,579,203 B2 | 8/2009 | Yamazaki et al. | |
| 7,629,611 B2 | 12/2009 | Inukai | |
| 7,820,464 B2 | 10/2010 | Yamazaki et al. | |
| 7,989,812 B2 | 8/2011 | Yamazaki et al. | |
| 8,133,748 B2 | 3/2012 | Yamazaki et al. | |
| 2001/0025959 A1 | 10/2001 | Yamazaki | |
| 2001/0038367 A1* | 11/2001 | Inukai | 345/76 |
| 2001/0055841 A1 | 12/2001 | Yamazaki et al. | |
| 2002/0000576 A1 | 1/2002 | Inukai | |
| 2002/0001886 A1 | 1/2002 | Ohtani | |
| 2002/0023426 A1 | 2/2002 | Schroeder | |
| 2002/0047568 A1 | 4/2002 | Koyama | |
| 2002/0070913 A1 | 6/2002 | Kimura et al. | |
| 2002/0097363 A1 | 7/2002 | Yudasaka | |
| 2002/0134979 A1 | 9/2002 | Yamazaki | |
| 2003/0089905 A1 | 5/2003 | Udagawa | |
| 2003/0089910 A1 | 5/2003 | Inukai | |
| 2003/0119230 A1 | 6/2003 | Chida | |
| 2003/0128839 A1 | 7/2003 | Shimazaki | |
| 2004/0003939 A1 | 1/2004 | Nishi et al. | |
| 2004/0008311 A1 | 1/2004 | Yudasaka | |
| 2004/0016927 A1 | 1/2004 | Takei | |
| 2004/0065902 A1 | 4/2004 | Yamazaki | |
| 2004/0113873 A1 | 6/2004 | Shirasaki | |
| 2004/0135146 A1 | 7/2004 | Yamazaki | |
| 2004/0135181 A1 | 7/2004 | Yamazaki | |
| 2005/0170096 A1 | 8/2005 | Yudasaka | |
| 2006/0256047 A1 | 11/2006 | Kimura et al. | |
| 2006/0286889 A1 | 12/2006 | Nishi et al. | |
| 2007/0052634 A1 | 3/2007 | Yamazaki et al. | |
| 2008/0029765 A1 | 2/2008 | Yamazaki et al. | |
| 2008/0265786 A1 | 10/2008 | Koyama | |
| 2008/0316152 A1 | 12/2008 | Kimura et al. | |
| 2009/0015743 A1 | 1/2009 | Ohtani et al. | |
| 2009/0109143 A1 | 4/2009 | Yamazaki et al. | |
| 2009/0284522 A1 | 11/2009 | Kimura | |
| 2009/0298210 A1 | 12/2009 | Yamazaki et al. | |
| 2010/0073352 A1 | 3/2010 | Inukai | |
| 2012/0056190 A1 | 3/2012 | Yamazaki et al. | |

FOREIGN PATENT DOCUMENTS

| | | |
|---|---|---|
| CN | 1213812 A | 4/1999 |
| CN | 1291792 | 4/2001 |
| EP | 0 376 329 A2 | 7/1990 |
| EP | 0 940 797 | 9/1999 |
| EP | 1 003 150 A1 | 5/2000 |
| EP | 1 058 311 | 12/2000 |
| EP | 1 063 630 A2 | 12/2000 |
| EP | 1 087 366 | 3/2001 |
| EP | 1 093 166 | 4/2001 |
| EP | 1 096 303 | 5/2001 |
| EP | 1 096 571 A2 | 5/2001 |
| EP | 1 109 225 A2 | 6/2001 |
| EP | 1 128 439 | 8/2001 |
| EP | 1 178 462 A2 | 2/2002 |
| EP | 1 310 997 | 5/2003 |
| EP | 1 505 648 | 2/2005 |
| EP | 1594116 A2 | 11/2005 |
| EP | 1 594 116 A3 | 9/2006 |
| JP | 62-092370 | 4/1987 |
| JP | 62092370 A | 4/1987 |
| JP | 08-213627 A | 8/1996 |
| JP | 8-234683 | 9/1996 |
| JP | 09-102615 A | 4/1997 |
| JP | 09-162414 A | 6/1997 |
| JP | 10-148847 A | 6/1998 |
| JP | 11-133463 A | 5/1999 |
| JP | 11-194363 A | 7/1999 |
| JP | 11-272233 A | 10/1999 |
| JP | 2000-214800 A | 8/2000 |
| JP | 2000-221942 | 8/2000 |
| JP | 2000-223715 | 8/2000 |
| JP | 2000-243963 A | 9/2000 |
| JP | 2000-259098 A | 9/2000 |
| JP | 2000-352941 A | 12/2000 |
| JP | 2001-005426 A | 1/2001 |
| JP | 2001-051622 | 2/2001 |
| JP | 2001-109399 | 4/2001 |
| JP | 2001-111053 A | 4/2001 |
| JP | 2001-119032 A | 4/2001 |
| JP | 2001-189192 | 7/2001 |
| JP | 2001-195015 | 7/2001 |
| JP | 2001-195016 A | 7/2001 |
| JP | 2001-196594 | 7/2001 |
| JP | 2001-236027 A | 8/2001 |
| JP | 2001-318623 | 11/2001 |
| JP | 2001-318627 A | 11/2001 |
| JP | 2001-318628 | 11/2001 |
| JP | 2001319877 A | 11/2001 |
| JP | 2002-006808 A | 1/2002 |
| JP | 2002-015861 A | 1/2002 |
| JP | 2002-057162 A | 2/2002 |
| JP | 2002-082651 A | 3/2002 |
| JP | 2002-108285 | 4/2002 |
| JP | 2002-278478 A | 9/2002 |
| JP | 2002-341790 A | 11/2002 |
| JP | 2003-508807 T | 3/2003 |
| JP | 2003-195810 | 7/2003 |

(56) References Cited

FOREIGN PATENT DOCUMENTS

| | | |
|---|---|---|
| JP | 2003-208110 | 7/2003 |
| JP | 2003-330391 A | 11/2003 |
| JP | 2007-041612 A | 2/2007 |
| KR | 0166580 | 3/1999 |
| WO | WO99-10862 | 3/1999 |
| WO | WO0117029 A1 | 3/2001 |
| WO | WO03-058328 | 7/2003 |

OTHER PUBLICATIONS

Office Action (Chinese Application No. 03102744.X) mailed Jul. 6, 2007 with English language translation, 20 pages.

\* cited by examiner

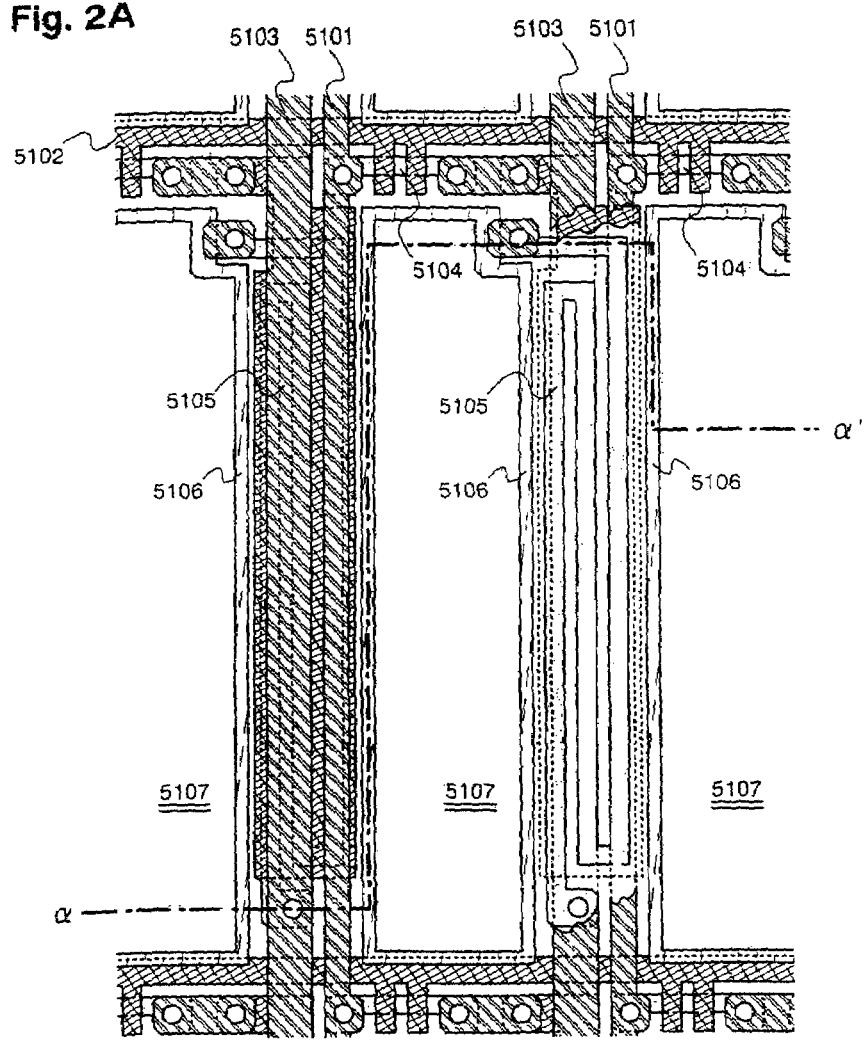
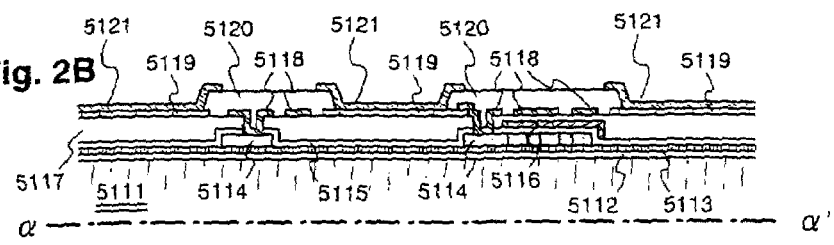

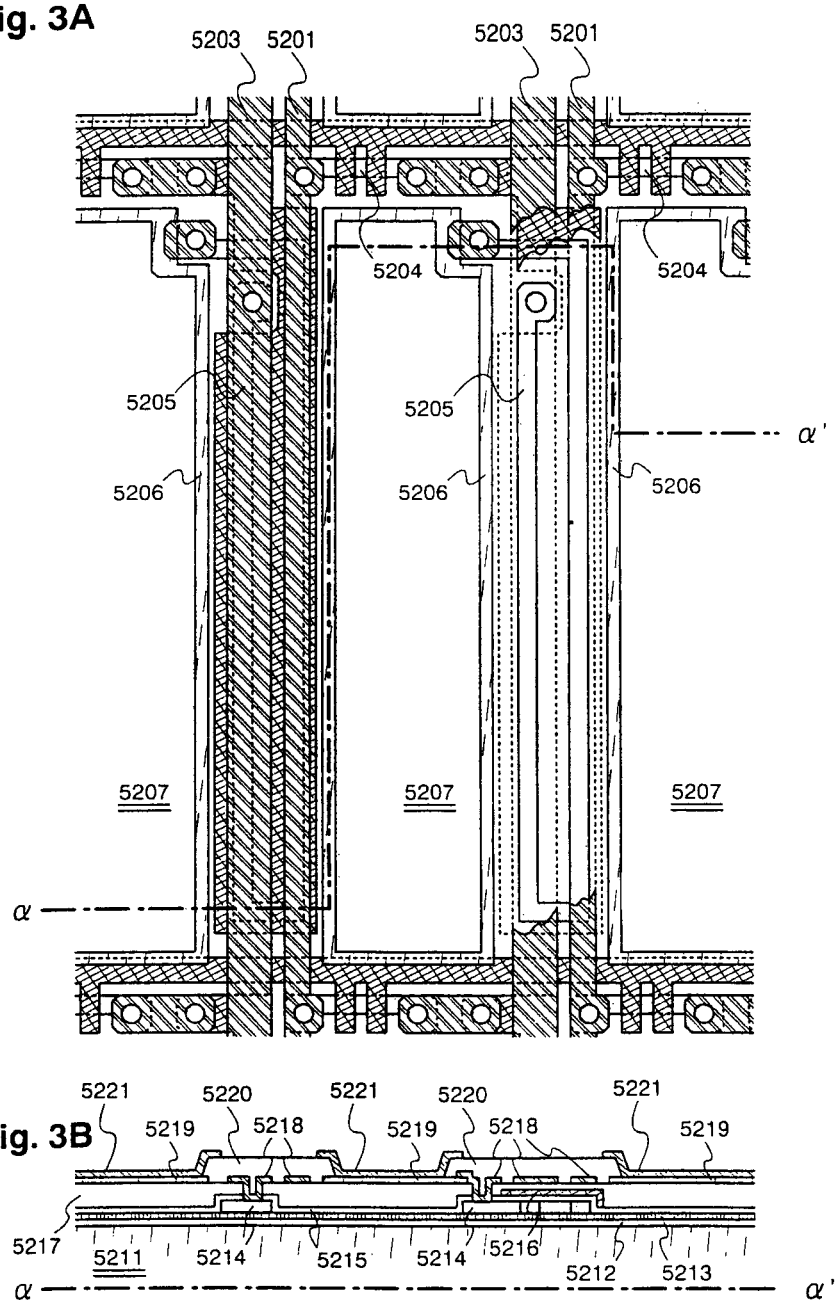

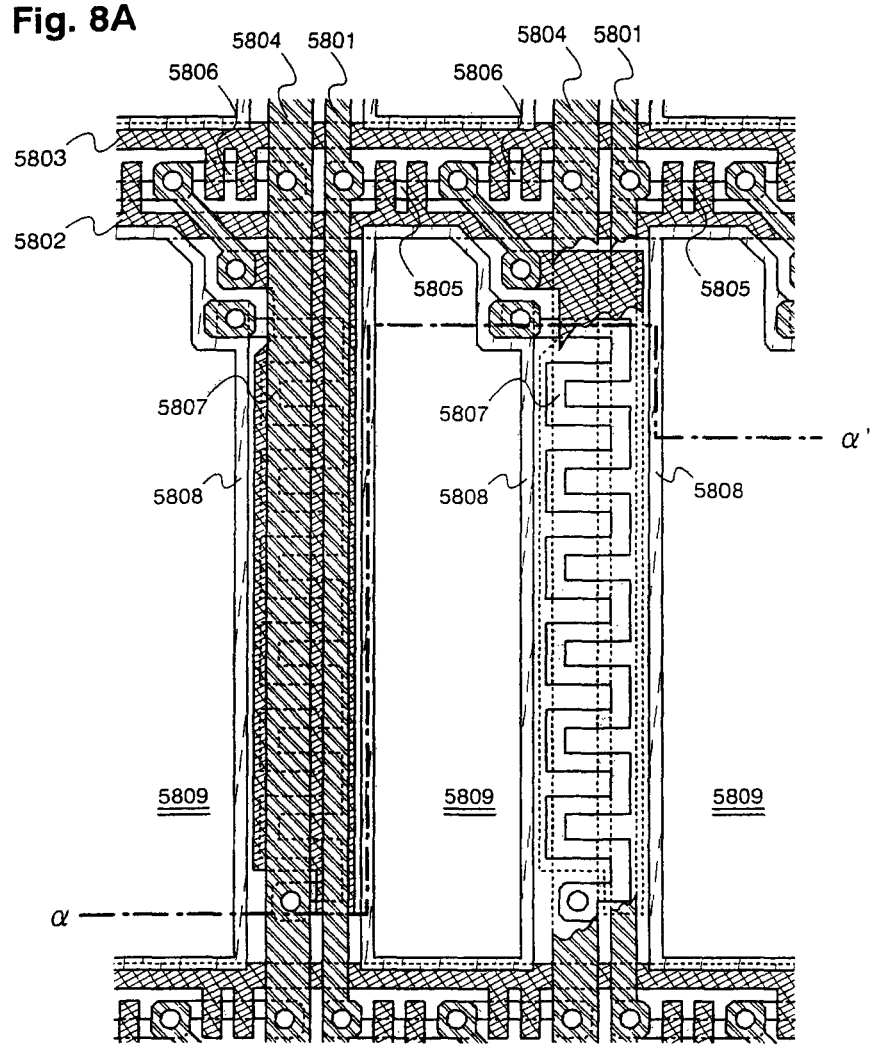
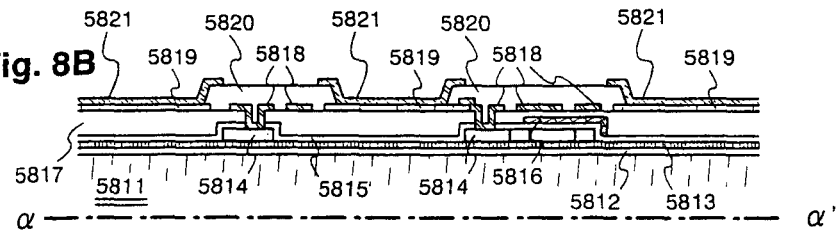

Prior Art
Fig. 12A
Prior Art
Fig. 12B
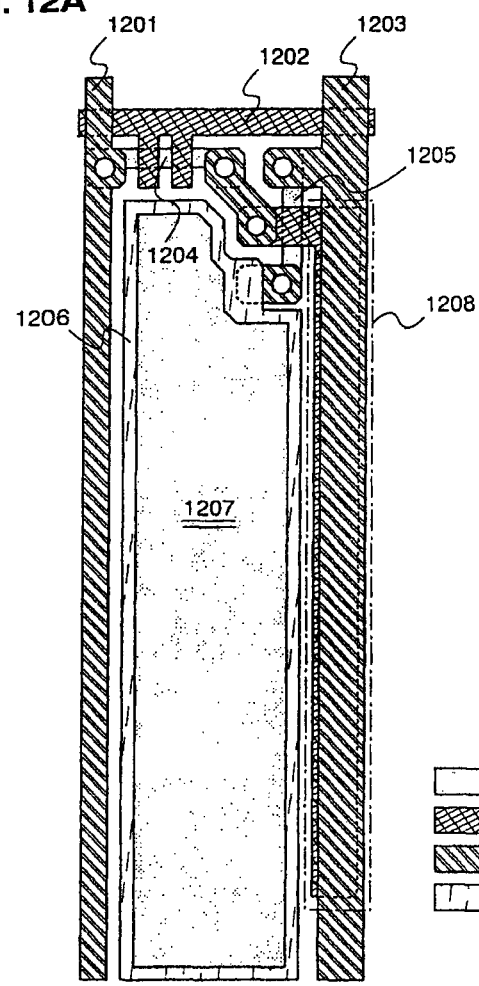
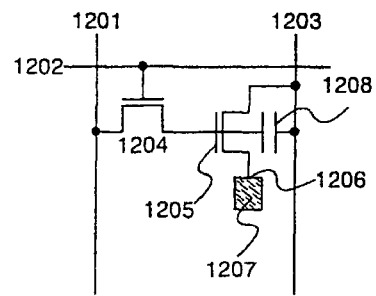
- ▢ semiconductor layer
- ▨ gate metal
- ▨ wiring
- ▢ transparent conductive film gate-source capacitance of
P-channel TFT (500/4) on working ($V_{GS}=-6V$)

gate-source capacitance of
P-channel TFT (500/4) on working ($V_{GS}=-6V$)

OFF condition ($V_{GS} > |V_{th}|$)

linear region ($V_{GS} - |V_{th}| > V_{DS}$)

saturated region ($V_{GS} - |V_{th}| \leqq V_{DS}$)

Fig. 22A
forming semiconductor islands
Fig. 22B
forming gate signal lines and gate electrodes
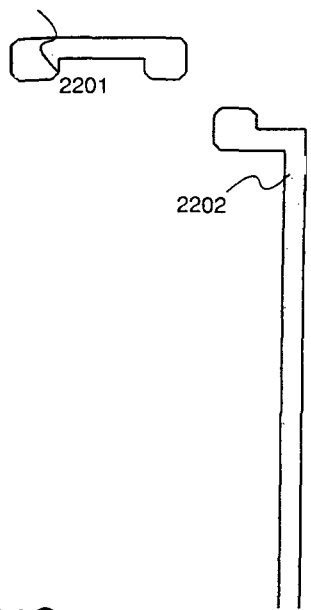
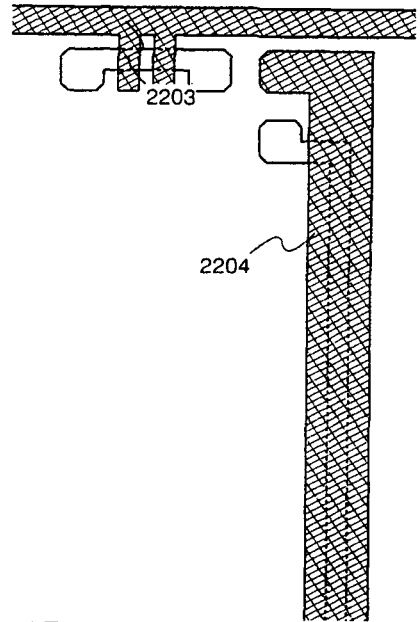
Fig. 22C
forming pixel electrodes, contact holes and wirings
Fig. 22D
forming partitioning walls and light emitting areas
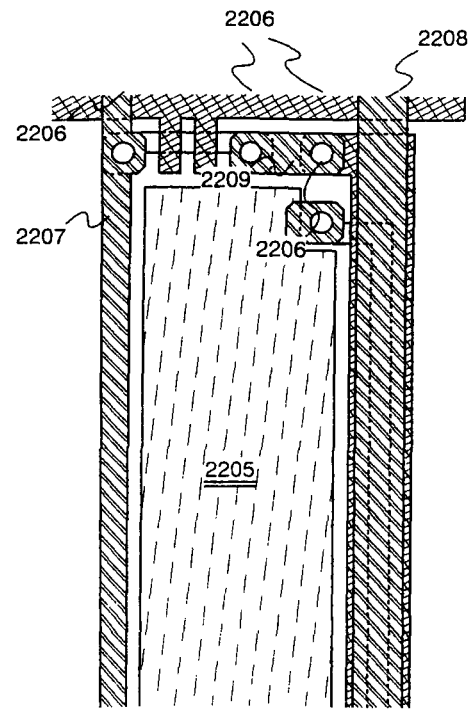
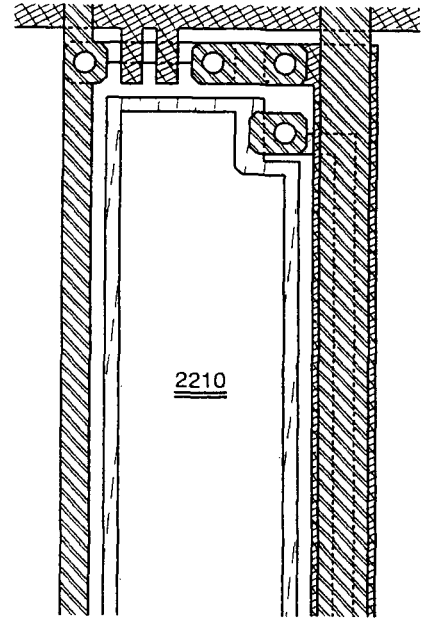

LIGHT-EMITTING DEVICE

BACKGROUND OF THE INVENTION

1. Field of the Invention

This invention relates to an electroluminescence (EL) element, and to a method of driving an electronic display manufactured by forming thin-film transistors (hereinafter abbreviated as TFTs) on a substrate. Particularly, the invention relates to a light-emitting device which uses semiconductor elements (elements formed from a semiconductor thin film). The invention further relates to electronic devices using the light-emitting device as a display unit.

In this specification, the EL elements include the ones which utilize emission of light from singlet excitons (fluorescence) and the ones which utilize the emission of light from triplet excitons (phosphorescence).

2. Description of the Related Art

In recent years, light-emitting devices having EL elements have been vigorously developed as self light emitting elements. Unlike the liquid crystal display devices, the light-emitting device is self light emitting type. The EL element has a structure in which an EL layer is held between a pair of electrodes (anode and cathode).

The light-emitting devices can include those of the passive matrix type and those of the active matrix type. Here, the devices of the active matrix type are suited for the applications where a high-speed operation is required for an increase of pixels accompanying an increase in the resolution and for movie display.

Each pixel in the organic EL panel of the active matrix type is provided with a holding capacitance (Cs) for holding the voltage. FIG. 12A illustrates an actual example of pixel constitution, and FIG. 12B is an equivalent circuit thereof. As disclosed in patent document 1, the capacitance Cs tends to be large and the light-emitting area of organic EL tends to be small correspondingly. In addition to the capacity Cs, shapes, numbers and arrangements of TFTs, wirings, contacts, partitioning walls and the like constituting pixels become factors for decreasing the light-emitting areas. As the light-emitting area decreases, the current density increases and the reliability of the organic EL element decreases seriously.

(Patent document 1)
Japanese Patent Laid-Open No. Hei 8-234683

Further, if an opening portion is formed in a complex shape in order to increase aperture ratio as much as possible, a shrink of the organic EL portion may be promoted. Here, the shrink of the EL portion is not a state where the EL layer physically shrinks, but a state where the effective area of the EL element (area of a portion where the EL element emits light) gradually shrinks starting from the end portions. Namely, as the shape of the opening portion becomes complex, the length of the end portion increase relative to the area of the opening portion promoting the shrink.

FIG. 20 illustrates an example of the constitution of a pixel portion in an active matrix type EL display device. A portion surrounded by a dotted line frame 2300 stands for a pixel portion which includes a plurality of pixels. A portion surrounded by a dotted line frame 2310 stands for one pixel.

Gate signal lines (G1, G2, ---, Gy) to which selection signals are input from a gate signal line drive circuit, are connected to gate electrodes of switching TFTs 2301 included in the pixels. Further, one of a source region and a drain region of the switching TFT 2301 included in each pixel is connected to a source signal line (S1 to Sx) to which signals from the source signal line drive circuit are input, and the other one is connected to the gate electrode of the driving TFT 2302. One of the source region or the drain region of the driving TFT 2302 included in each pixel is connected to a current supply line (V1, V2, ---,Vx), and the other one is connected to one electrode of the EL element 2304 included in each pixel. Further, each pixel may be provided with capacitance means 2303 for holding a voltage between the gate and the source of the driving TFT 2302 during a display period.

The EL element 2304 has an anode, a cathode and an EL layer provided between the anode and the cathode. When the anode of the EL element 2304 is connected to the source region or the drain region of the driving TFT 2302, the anode of the EL element 2304 works as a pixel electrode and the cathode thereof works as an opposing electrode. Conversely, when the cathode of the EL element 2304 is connected to the source region or the drain region of the driving TFT 2302, the cathode of the EL element 2304 works as a pixel electrode and the anode thereof works as an opposing electrode.

In this specification, the potential of the opposing electrode is called opposing potential. A power source which gives an opposing potential to the opposing electrode is called opposing power source. A difference between the potential of the pixel electrode and the potential of the opposing electrode is an EL drive voltage. The EL drive voltage is applied to the EL layer held between the pixel electrode and the opposing electrode.

As a gradation display method for the light-emitting device, there can be exemplified an analog gradation system and a digital gradation system.

Next, described below are the values of when Cs is provided in the cases of the analog gradation system and the digital gradation system.

In the case of the analog gradation system, in general, an analog video signal is written into each pixel once in one frame period. The analog video signals are input to the pixels in the form of an analog voltage or an analog current. In the case of the analog voltage, the analog voltage that is written is stored in the holding capacitors of the pixels for one frame period (one frame period lasts 16.66 ms when the frame frequency is 60 Hz) In the case of the analog current, the current that is written is once converted into an analog voltage in the pixels. The analog voltage must be maintained for one frame period.

In the case of the digital gradation system, as described above, the digital video signal must be written a plural number (n) of times in one frame period. In the case of the 4-bit gradation, n=4 times or more times and in the case of the 6-bit gradation, n=6 times or more times. Therefore, the analog voltage must be maintained for a period of the longest sub-frame among the n sub-frames divided from one frame period.

Next, described below is a relationship between the driving TFT and the EL element.

Referring to FIG. 15A, a driving TFT 1505 and an EL element 1506 are connected in series between the current supply line and the opposing power source in each pixel. As for the current flowing into the EL element 1506, a point where the Vd-Id curve of the driving TFT intersects the V-I curve of the EL element in FIG. 15B becomes an operation point. Electric current flows depending upon a voltage between the source and the drain of the driving TFT 1505 and upon a voltage between the electrodes of the EL element 1505.

When the gate-source voltage ($|V_{GS}|$) of the driving TFT 1505 is greater than the source-drain voltage ($|V_{DS}|$) by more than a threshold voltage, the driving TFT 1505 operates in a linear region (driving on a constant voltage). When the gate-source voltage ($|V_{GS}|$) of the driving TFT 1505 is smaller than the source-drain voltage ($|V_{DS}|$), the driving TFT 1505 operates in a saturated region (driving on a constant current).

When the driving TFT 1505 is operated in the linear region, namely, when the operation of the driving TFT 1505 at the operation point is included in the linear region, $|V_{DS}|$ of the driving TFT 1505 becomes very smaller than the voltage ($|V_{EL}|$) across the electrodes of the EL element 1506, and variation in the characteristics of the driving TFT 1505 does not almost affect the current that flows through the EL element 1506. However, if the resistance of the EL element 1506 varies due to a change in the temperature or aging, the electric current is affected thereby and undergoes a change. When, for example, the EL element 1506 is degraded, and the voltage-current characteristics thereof change from 1601 to 1602 as shown in FIG. 16A, the operation point, too, shifts from 1603 to 1604. Here, when the driving TFT 1505 is operating in the linear region, the current flowing through the EL element 1506 decreases by AID accompanying the shift of the operation point. The brightness, therefore, decreases.

When the driving TFT 1505 is operated in the saturated region, on the other hand, the drain current ($I_{DS}$) of the driving TFT 1505 remains constant as shown in FIG. 16B despite the voltage-current characteristics of the EL element 1506 have changed from 1611 o 1612 due to degradation of the EL element. Despite the operation point has changed from 1613 to 1614, therefore, a constant current flows into the EL element 1506. Accordingly, a change in the brightness is smaller than that of when the driving TFT 1505 is operated in the linear region.

The -operation points can all be brought into the saturated region by setting the channel length and channel width of the driving TFTs and by selecting the characteristics and driving voltages of the driving TFTs and EL elements.

When the driving TFT 1505 is operated in the saturated region, however, the current that flows into the EL element 1506 is determined solely by the VGS-IDS characteristics only of the TFT. Therefore, the variation in the brightness of the EL element 1506 is reflected by the variation in the characteristics of the driving TFT 1505. Further, the electric current is seriously affected by a change in the gate-source voltage $V_{GS}$ during the holding period. The drain current IDS in the saturated region is expressed by the formula (1), $$I_{DS} = \beta/2 \times (V_{GS} - |V_{th}|)^2 \quad (1)$$

Due to an off-leak current of the switching TFT 1504, the electric charge on the gate electrode of the driving TFT 1505 leaks into the source signal line 1501, and the gate-source voltage $|V_{GS}|$ of the driving TFT changes correspondingly resulting in a change in the drain current $I_{DS}$. Therefore, a capacitor is necessary for compensating the loss of gate-source voltage $V_{GS}$ of the driving TFT caused by the leak of the electric charge from the switching TFT 1504. This is called holding capacitance. The magnitude of the holding capacitance is determined by a relationship between the $V_{GS}$-$I_{DS}$ characteristics of the driving TFT and the amount of change $\Delta I_{EL}$ in the current that accompanies a change of brightness of the EL element 1506 by one gradation. As will be understood from the formula (1), the drain current $I_{DS}$ varies in proportion to the second power of $V_{GS}$. Therefore, a change in the drain current $I_{DS}$ is very susceptible to a change in the gate-source voltage $|V_{GS}|$. From $\Delta I_{EL}$, the amount of change $\Delta V_{GS}$ in the gate-source voltage $V_{GS}$ allowed for the driving TFT 1505 is obtained. The required magnitude of the holding capacitance is determined from the off-leak current $I_{OFF}$ of the switching TFT and the holding time by using the formulas (2) and (3), $$I_{OFF} = C \Delta V_{GS}/\Delta t \quad (2)$$

$$CS = I_{OFF} \times \Delta t / \Delta V_{GS} \quad (3)$$

where 66 t is a very short period of time and $\Delta V_{GS}$ is an increment of the gate-source voltage of the driving TFT 1505.

In contrast with the digital gradation system which effects the writing operation a plural number of times per a frame period, the analog gradation system permits the writing operation to be done only one time in one frame. Therefore, the holding time becomes long and a larger holding capacitance is necessary.

Due to the above reasons, further, the channel lengths of the driving TFTs must be maintained long in the pixels. Further, the aperture ratio decreases as the size of the driving TFT increases.

SUMMARY OF THE INVENTION

This invention was accomplished in view of the above problem, and provides a light-emitting device which realizes a high aperture ratio and in which the quality of image is little affected by the variation of the driving TFTs.

For this purpose, this invention employs means as described below.

In the light-emitting device of this invention, a large holding capacitance Cs is not provided in the pixel portion but, instead, the channel length and the channel width of the driving TFTs are increased, and the capacitance (channel capacitance) between the gate electrode of the driving TFT and the channel-forming region is utilized as the holding capacitance Cs.

Referring to FIG. 18, a gate electrode 1804 of a TFT is constituted by the gate electrode 1804, source electrode 1807 and drain electrode 1808 with a gate-insulating film 1803 sandwiched therebetween. Therefore, gate-source capacitances 1811, 1812 essentially exist among the terminals and among the gate electrode 1804, source electrode 1807 and source region 1802a, and gate-drain capacitances 1813 and 1814 essentially exist among the gate electrode 1804, drain electrode 1808 and drain region 1802b.

If a gate-source voltage necessary for turning the TFT on is applied between the gate electrode 1804 and the source region 1802a of the TFT, a channel 1810 is formed in the channel-forming region 1809 and a drain current flows. At this moment, a channel capacity 1815 generates between the gate electrode 1804 and the channel.

The channel region changes depending upon the voltage conditions of the gate electrode 1804, source electrode 1807 and drain electrode 1808, and the channel capacitance changes, too.

A change in the channel region due to the voltage conditions will now be described with reference to FIG. 17. Described here is an example of the P-channel TFT.

Referring to FIG. 17B, when the TFT is in the turned-off state, no channel is formed in the channel-forming region 1704 and the channel capacitance can be neglected.

Referring next to FIG. 17C, when the TFT is operated in the linear region, a channel 1706 is formed in the whole region between the source and the drain, and the positive holes are so distributed as to linearly decrease from the source toward the drain. Since there exist positive holes on the whole semiconductor surface of the channel-forming region, the channel capacitance is maintained to a sufficient degree.

Referring next to FIG. 17D, when the TFT is operated in the saturated region, a channel 1706 is formed but there is distributed no positive hole on the semiconductor surface on the drain side. However, the positive holes exist on the semiconductor surface on the source side, and a sufficiently large capacitance is maintained between the gate and the source.

In laying out the pixels, further, the wiring is arranged under the partitioning wall and the driving TFTs are arranged under the wiring to maintain an aperture ratio despite the driving TFTs have an increased size. In the case of the three-transistor type pixels, further, the switching TFT and the erasing TFT are linearly arranged to maintain an aperture ratio, namely, to obtain a simple opening portion. Here, the switching TFT and the erasing TFT are not necessarily needed to be exactly arranged on a straight line. Upon increasing the aperture ratio, the current density decreases despite the same brightness is maintained by the EL element, and the rate of deterioration of the EL element decreases. Besides, a simple opening portion enables the EL element to be less affected by the shrink.

Constitutions of the invention will be described below.

A light-emitting device of the invention comprises a plurality of pixels having a light-emitting element, each of the plurality of pixels having a source signal line, a gate signal line, a current feed line, a switching transistor and a driving transistor, wherein a capacitor for holding a gate-source voltage of the driving transistor is constituted by a capacitance between the gate electrode and the channel-forming region of the driving transistor.

A light-emitting device of the invention comprises a plurality of pixels having a light-emitting element, each of the plurality of pixels having a source signal line, a gate signal line, a current supply line, a switching transistor and a driving transistor, wherein a capacitor for holding a gate-source voltage of the driving transistor is constituted by a capacitance between the gate electrode and the source region of the driving transistor or between the gate electrode and the drain region of the driving transistor.

A light-emitting device of the invention comprises a plurality of pixels having a light-emitting element, each of the plurality of pixels having a source signal line, first and second gate signal lines, a current supply line, a switching transistor, an erasing transistor and a driving transistor, wherein a capacitor for holding a gate-source voltage of the driving transistor is constituted by a capacitance between the gate electrode and the channel-forming region of the driving transistor.

A light-emitting device of the invention comprises a plurality of pixels having a light-emitting element, each of the plurality of pixels having a source signal line, first and second gate signal lines, a current supply line, a switching transistor, an erasing transistor and a driving transistor, wherein a capacitor for holding a gate-source voltage of the driving transistor is constituted by a capacitance between the gate electrode and the source region of the driving transistor or between the gate electrode and the drain region of the driving transistor.

A light-emitting device of the invention comprises a plurality of pixels having a light-emitting element, each of the plurality of pixels having a source signal line, a gate signal line, a current supply line, a switching transistor and a driving transistor, wherein the source signal line, the current supply line and the driving transistor are arranged at positions overlapped with an insulating film formed at positions separating the neighboring light-emitting areas of the plurality of pixels.

A light-emitting device of the invention comprises a plurality of pixels having a light-emitting element, each of the plurality of pixels having a source signal line, first and second gate signal lines, a current supply line, a switching transistor and a driving transistor, wherein the source signal line, the current supply line and the driving transistor are arranged at positions overlapped on an insulating film formed at positions separating the neighboring light-emitting areas of the plurality of pixels.

In a light-emitting device of the invention, the switching transistor and the erasing transistor are arranged at such positions that a point in the source region and a point in the drain region of the switching transistor, and a point in the source region and a point in the drain region of the erasing transistor, are arranged at positions which are all included on a straight line.

In a light-emitting device of the invention, the driving transistor is arranged at a position where it is overlapped on a portion of the source signal line or on a portion of the current supply line.

In a light-emitting device of the invention, the semiconductor layer forming the channel region of the driving transistor is of a U-shape, an S-shape, a spiral shape or a meandering shape.

In a light-emitting device of the invention, when the driving transistor has a channel length L and a channel width W, then, L×W>200 µm$^2$.

In a light-emitting device of the invention, when a gate-source voltage of the driving transistor is $V_{GS}$, a source-drain voltage is $V_{DS}$ and a threshold voltage is $V_{th}$, the driving transistor is so driven that $|V_{DS}|<|V_{GS}|-|V_{th}|$.

In a light-emitting device of the invention, when a gate-source voltage of the driving transistor is $V_{GS}$, a source-drain voltage is $V_{DS}$ and a threshold voltage is $V_{th}$, the driving transistor is so driven that $|V_{DS}|\geq|V_{GS}|-|V_{th}|$.

In a light-emitting device of the invention, the driving transistor is so driven that the gate-source voltage of the driving transistor is not lower than 4 V but is not higher than 14 V.

In a light-emitting device of the invention, when the driving transistor has a channel length L and a channel width W, then, L>5W.

In a light-emitting device of the invention, when the driving transistor has a channel length L and a channel width W, L/W of each of the driving transistors included in the pixels emitting red light, green light and blue light, respectively, are different from each other.

BRIEF DESCRIPTION OF THE DRAWINGS

FIGS. 2A and 2B are diagrams illustrating a layout of a pixel portion fabricated according to the invention.

FIGS. 3A and 3B are diagrams illustrating a layout of a pixel portion fabricated according to the invention.

FIGS. 8A and 8B are diagrams illustrating a layout of a pixel portion fabricated according to the invention.

FIGS. 12A and 12B are diagrams illustrating a 2-transistor type pixel laid out according to a conventional method;

FIGS. 22A to 22D are diagrams schematically illustrating the steps of fabricating the pixel portion.

DETAILED DESCRIPTION OF THE PREFERRED EMBODIMENTS

Embodiment 1

Figure 1A:
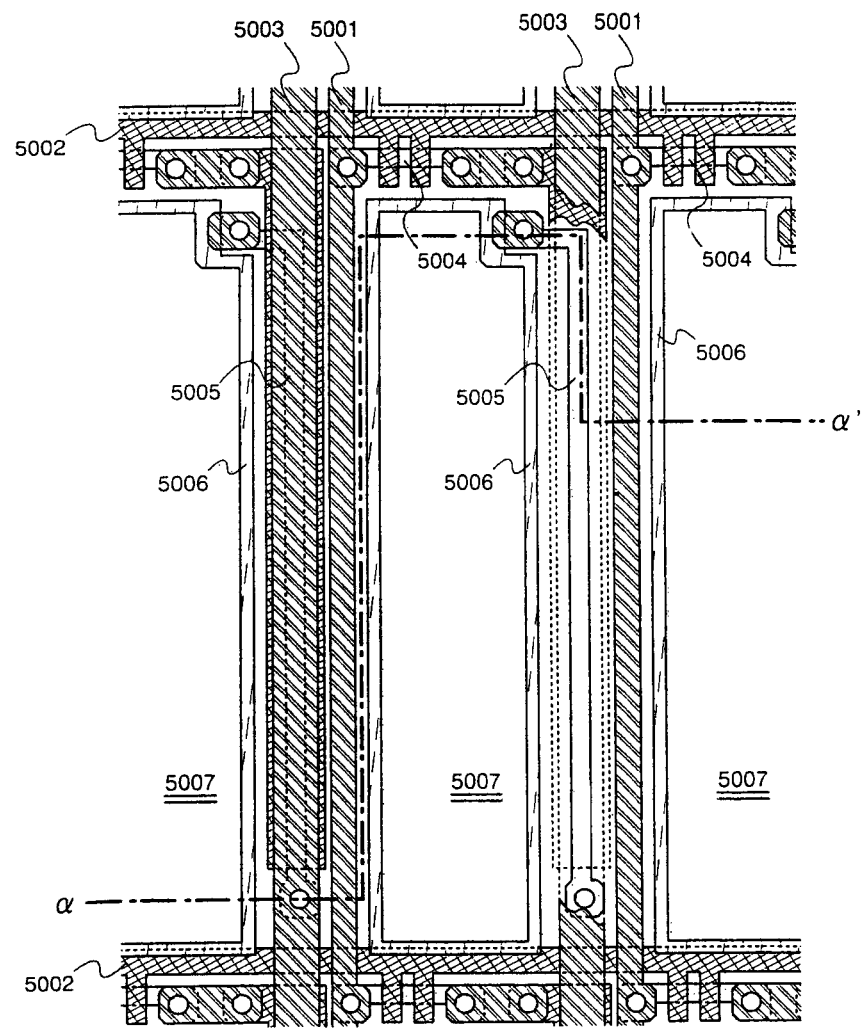
FIGS. 1A and 1B are diagrams illustrating a layout of a pixel portion fabricated according to the invention.

First, the embodiment will be described with reference to FIG. 1. Here, the light-emitting device produces a full-color display and wherein either the source regions or the drain regions of the driving TFTs of pixels R for emitting light of red color are connected to a current supply line for red color, either the source regions or the drain regions of the driving TFTs of pixels G for emitting light of green color are connected to a current supply line for green color, and either the source regions or the drain regions of the driving TFTs of pixels B for emitting light of blue color are connected to a current feed line for blue color. The EL materials of the EL elements of R, G and B are separately applied like stripes.

In FIG. 1, the partitioning walls are covering the regions other than the light-emitting areas 5007. Among the partitioning walls 5020, those partitioning walls formed in parallel with the stripes serve as coloring margins. The places where there exist the partitioning walls for coloring margin cannot be utilized as light-emitting areas. Therefore, the source signal lines 5001 and the current supply lines 5003 are arranged under the partitioning walls. Next, the driving TFTs 5005 are arranged under the source signal lines 5001 and under the current supply lines 5003. Here, they may be arranged under the source signal lines and the current supply lines possessed by the neighboring pixels.

In this arrangement, the gate electrodes of the driving TFTs are overlapped with potions of the current supply lines. The current supply lines have been fixed to a predetermined potential at all times. Therefore, a capacitance between the gate electrode and the current supply line of the driving TFT can be utilized as part of the holding capacitor Cs.

The driving TFT 5005 has an increased channel length and an increased channel width so as to also work as a holding capacitor and, further, to suppress variation in the characteristics. However, upon arranging the driving TFT 5005 under the partitioning wall for coloring margin, the aperture ratrio is prevented from decreasing despite of an increase in the channel length and the channel width.

Embodiment 2

When three transistors are used for constituting a pixel, the two transistors, namely, a switching TFT and an erasing TFT, excluding the driving TFT, are linearly arranged to maintain aperture ratio in order to realize a further simplified opening portion. The opening portion of a simple shape which is close to a rectangular shape helps decrease the effect of shrink.

Embodiment 3

In determining the channel length and the channel width of the driving TFT, it is necessary to increase the channel length and the channel width as much as possible and, when the driving TFT is to be operated in the saturated region, to select the channel length to be larger than the channel width, so that the gate-source voltage $V_{GS}$ is little affected by the threshold voltage. Upon increasing the channel length, the characteristics of the driving TFT are more flattened in the saturated region. Here, if the gate-source voltage $V_{GS}$ is increased too much, problems concerning the consumption of electric power and breakdown voltage of the driving TFTs will arise. It is therefore desired that the channel length and the channel width are so adjusted that $|V_{GS}|$ is not lower than 4 V but is not higher than 14 V.

According to the embodiments 1 to 3, the size of the driving TFT is increased and the channel length L is increased relative to the channel width W, making it possible to use the TFTs having excellently homogeneous current characteristics in the saturated region as the driving TFTs for the pixels and preventing the brightness of the EL elements from being affected by the variation of the driving TFTs.

Further, the holding capacitor is created by the channel capacitance of the driving TFT and is arranged at a position where it is overlapped with the partitioning wall outside the light-emitting area. Therefore, a high aperture ratio can be expected.

Embodiment 4

Light emitting efficiencies of EL elements of R, G and B are generally different from each other. Therefore, characteristics of electric current of the driving TFTs are all the same, it is required to make differences between $V_{GS}$ values of the driving TFTS in order to make differences between electric current values of those. Therefore, when differences of light emitting efficiencies of each of R, G and B EL elements are large, differences of $V_{GS}$ values can be large and it can be difficult to set voltages up.

In this case, it is desired to adjust characteristics of electric current by changing a ratio of channel length/channel width of the driving TFTs corresponding to light emitting elements of R, G and B. Here, aperture ratios of R, G and B light emitting elements are the same by adjusting channel lengths and channel widths of driving TFTs within a range where the driving TFTs does not protrude from the region of partitioning walls for a coloring margin. Also, the channel capacitance can be sufficiently obtained by adjusting the ratios of channel length/channel width corresponding to each of the light emitting elements of R, G and B such that those increase.

EXAMPLES

Working Examples of the invention will now be described.

Example 1

Figure 13A:
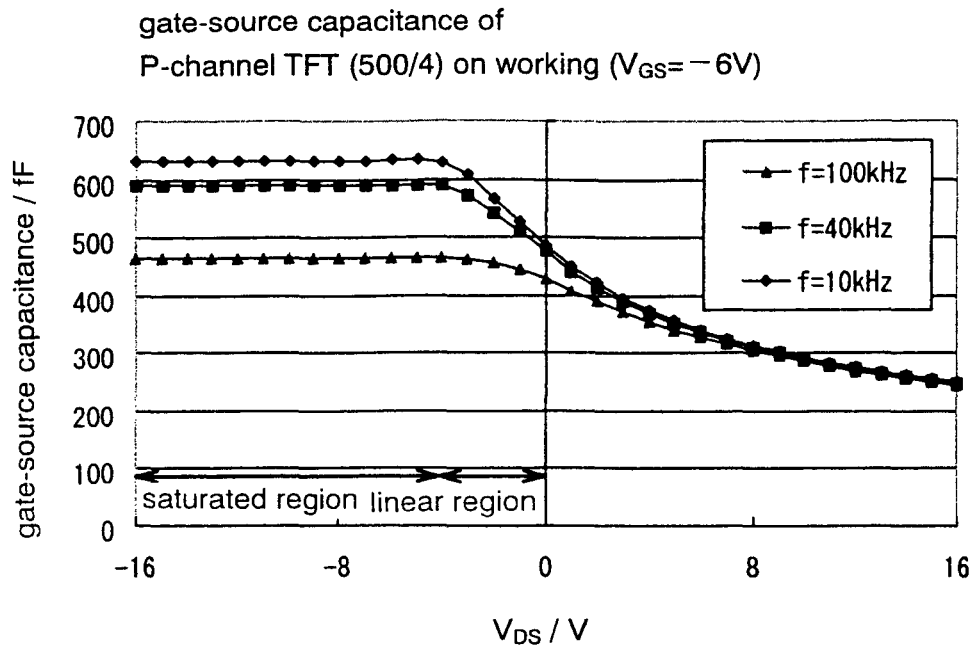
FIGS. 13A and 13B are diagrams illustrating measured channel capacitances of a TFT.
Figure 13B:
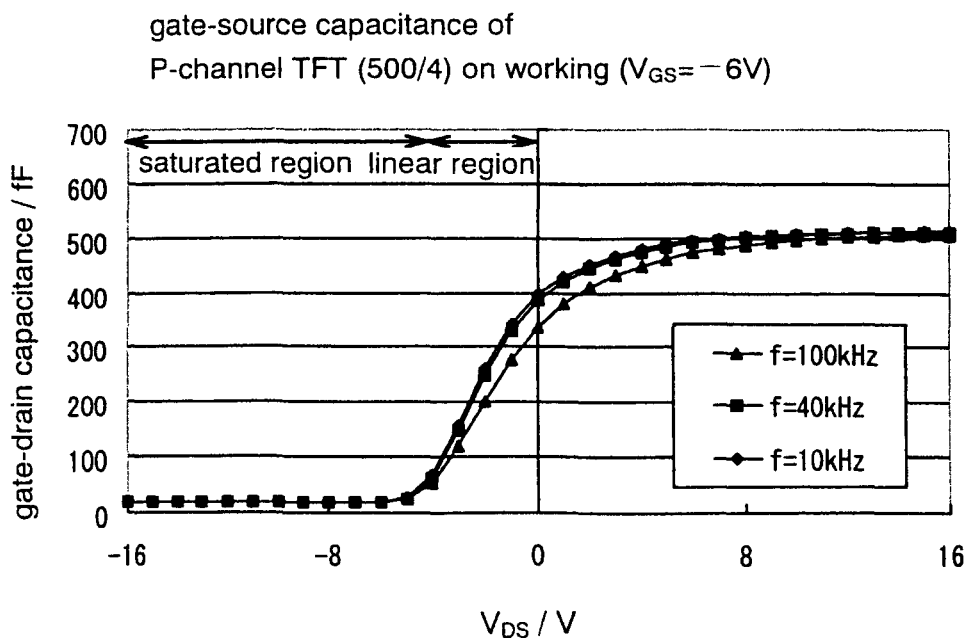

FIG. 13 illustrates actually measured gate-source capacitances and gate-drain capacitances which are measured. The gate-source voltage $V_{GS}$ is maintained at −6V, and the drain-source voltage $V_{DS}$ is varied between 16 V and −16 V. The saturated region starts as $V_{DS}$ becomes about −5V or lower. The sum of gate-source capacitances and gate-drain capacitances in FIGS. 13A and 13B is a capacity of the driving TFT.

Figure 17A:
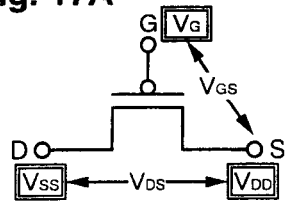
FIGS. 17A to 17D are diagrams illustrating a behavior of electric charges near a channel when a TFT is in operation.
Figure 17B:
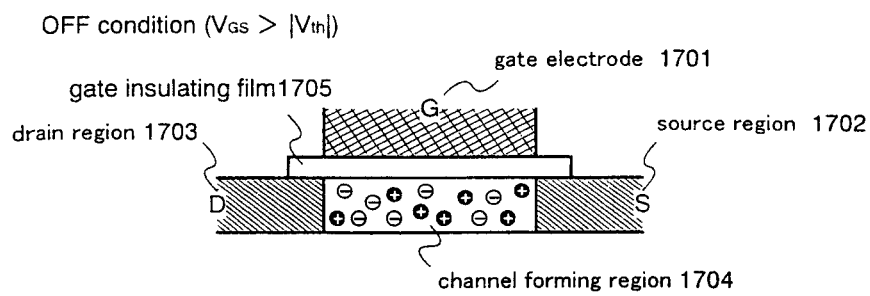
Figure 17C:
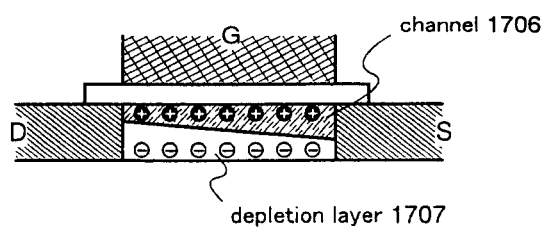
Figure 17D:
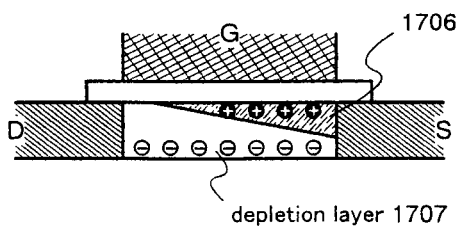
Figure 18:
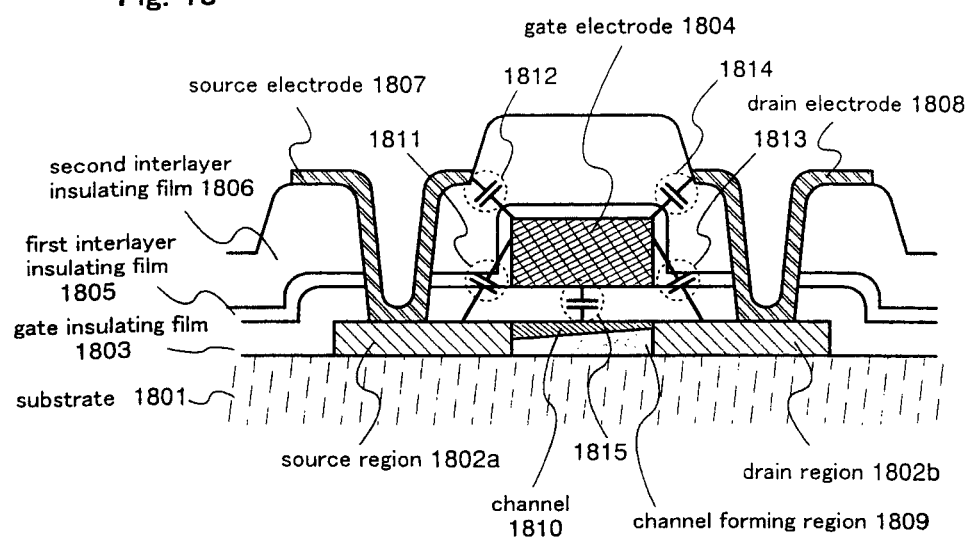
FIG. 18 is a diagram illustrating capacitor elements in each part of a TFT.

When the driving TFT is driven in the linear region as described with reference to FIG. 17C, a channel is formed on the whole semiconductor surface, and a sufficient amount of capacitance can be maintained.

When the driving TFT is driven in the saturated region, no channel is formed on the side of the drain region as described with reference to FIG. 17C, and the gate-drain capacity assumes a value close to 0 as illustrated in FIG. 13B. However, since a channel is formed on the side of the source region, the capacitance can be sufficiently supplemented by the gate-source capacitance as illustrated in FIG. 13A. When it is desired to drive the driving TFT in the saturated region, therefore, a sufficient amount of channel capacitance can be maintained by using the driving TFT of the P-channel type.

From the above description, a large holding capacitor Cs is not formed in the pixels, and a high aperture ratio is obtained by utilizing the channel capacitance of the driving TFT. Further, an increase of the product of the channel length and the channel width helps uniformalizing a variation in crystallinity of the semiconductor constituting the driving TFTs and, hence, suppress a variation in on-current $I_{on}$ of the elements.

Even when the driving TFTs are to be driven in the saturated region, a problem arises concerning the variation in the $V_{GS}$-$I_{ds}$ characteristics of the driving TFTs in the pixels. In this case, the current flowing into the EL element is maintained unchanged but the channel length is increased to be sufficiently larger than the channel width thereby to improve saturation characteristics in the saturated region. Upon increasing the channel length, on the other hand, a decreased amount of electric current is supplied to the EL element. Therefore, a desired electric current is supplied to the EL element by increasing the gate-source voltage $V_{GS}$. Therefore, the gate-source voltage $V_{GS}$ that has become sufficiently larger than the threshold voltage is little affected by the variation, and the variation in the drain-source current $I_{DS}$ is further decreased. With the saturation characteristics being improved as a result of increasing the channel length, the drain-source current $I_{DS}$ remains nearly constant in the saturated region. Therefore, even if the resistance changes due to degradation of the EL element, almost the same amount of current is supplied with the EL element.

Figure 14:
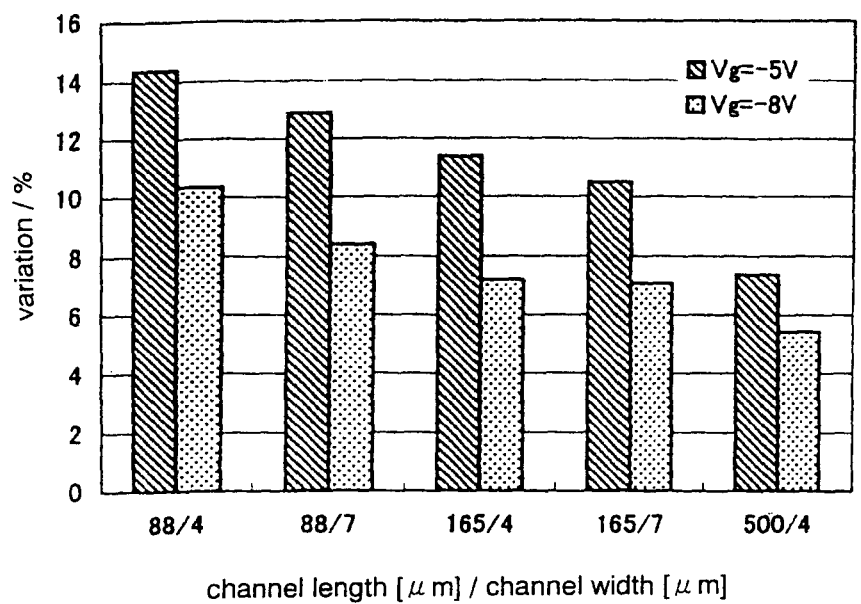
FIG. 14 is a diagram illustrating the measured variation in the drain-source current $I_{DS}$ of the TFT.
Figure 15A:
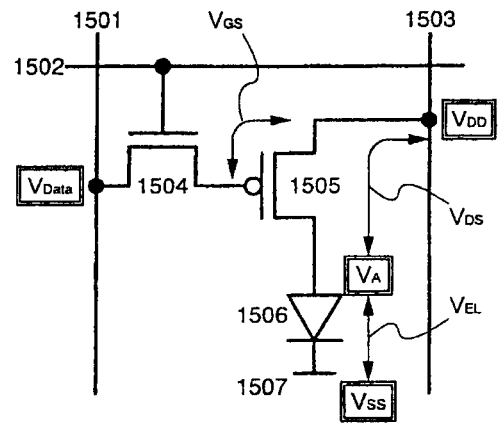
FIGS. 15A and 15B are diagrams illustrating operation points of an EL element.
Figure 15B:
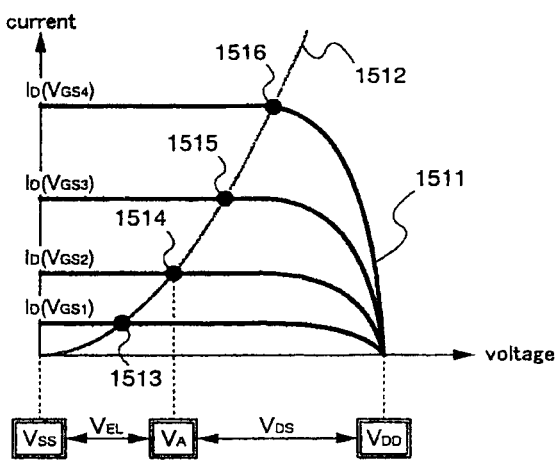
Figure 16A:
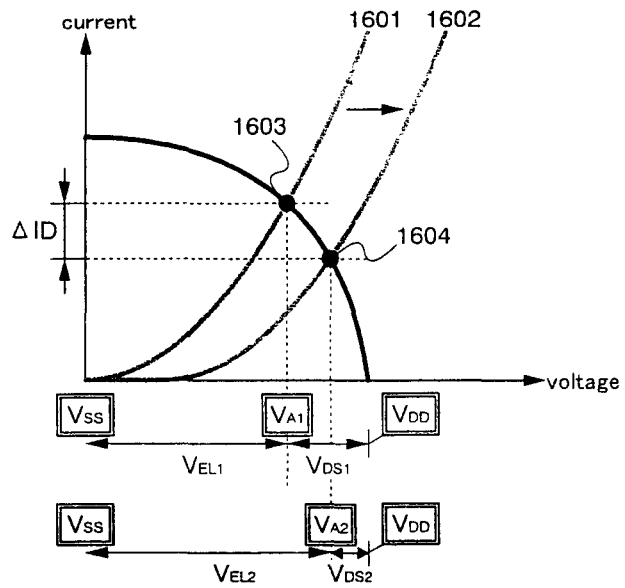
FIGS. 16A and 16B are diagrams illustrating degradation and effect to the brightness of the EL element when the operation range of the driving TFT is in a linear region and in a saturated region.
Figure 16B:
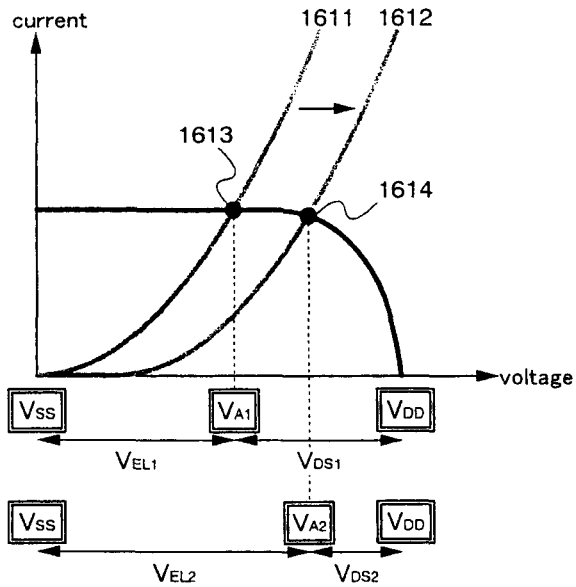

FIG. 14 is a diagram illustrating variation in the measured current $I_{ds}$ of the TFT of when the channel length and channel width are increased, and the channel length is sufficiently increased with respect to the channel width.

The gate-source voltage $|V_{GS}|$ is fixed to 5 V, the drain-source voltage $|V_{DS}|$ is fixed to 8 V, and the drain-source current $I_{DS}$ is measured by using a plurality of elements having different channel lengths and channel widths. As will be understood from FIG. 14, the variation in the drain-source current $I_{DS}$ can be suppressed by increasing the area (channel length×channel width) of the channel-forming region. When $|V_{GS}|$ of 5 V is compared with 8 V in FIG. 14, it is found that the variation in $I_{DS}$ is suppressed as $V_{GS}$ becomes very larger than $V_{th}$.

Example 2

The constitution and layout of the 2-transistor type pixels will be described with reference to FIGS. 1A and 1B.

Figure 1B:
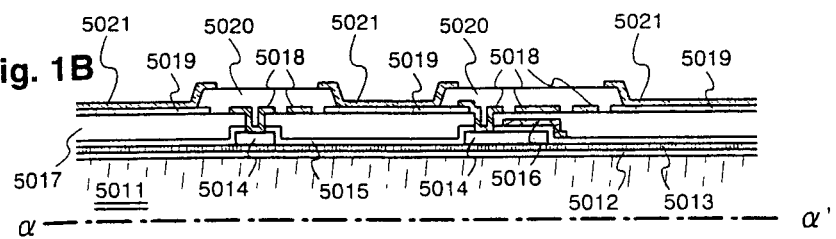

The pixel of FIGS. 1A and 1B is constituted by a source signal line 5001, a gate signal line 5002, a current supply line 5003, a switching TFT 5004, a driving TFT 5005, a pixel electrode 5006, and partitioning walls covering the areas other than the light-emitting area 5007. The gate electrode of the switching TFT 5004 is connected to the gate signal line 5002, the source side thereof is connected to the source signal line 5001, and the drain side thereof is connected to the gate electrode of the current supply line 5005. Further, the source side of the driving TFT 5005 is connected to the driving TFT 5003, and the drain side thereof is connected to the pixel electrode 5006. In FIG. 1B, 5011 denotes a substrate, 5012 denotes a base film, 5013 denotes a base film, 5018 denotes a wiring, 5019 denotes a pixel electrode, and 5021 denotes an EL layer.

Among the partitioning walls covering the areas other the light-emitting area 5007, the partitioning wall provided between the right and left neighboring pixels serves as a coloring margin that is necessary when separately producing the colors R, G and B. It is desired that the partitioning wall provided between the right and left neighboring pixels has a width of about 30 µm.

Here, the partitioning wall for coloring margin cannot be used as the light-emitting area. Therefore, the source signal line 5001 and the current supply line 5003 are arranged under the partitioning wall of the width of 30 µm. Next, the driving TFT 5005 is arranged under the source signal line 5001 and the current supply line 5003. Here, the driving TFT 5005 may be arranged under the source signal lines and the current supply lines possessed by the neighboring pixels.

The holding capacitor can be realized by a channel capacitance created by a first interlayer insulating film 5017 located between the semiconductor layer 5014 and the gate electrode 5016 of the driving TFT 5005.

Here, the holding time is set to be 1 ms and $I_{off}$ of the driving TFT is set to be 1 pA by the digital gradation of a short holding period, and the amount $\Delta V_{GS}$ of change in the gate-source voltage $V_{GS}$ of the driving TFT is set to be about 0.02 V when the brightness of the EL element changes by one gradation. From the formula (3), the holding capacitance that is necessary is 50 fF. If the thickness of the gate-insulating film 5015 is selected to be 120 nm and the specific inductivity to be 4, then, the channel capacitance becomes about 60 fF with the channel length × channel width=200 µm². Thus, in order to attain a satisfactory capacitance, it is preferred that the channel length × channel width is 200 µm² or more.

Further, the variation of the elements decreases with an increase in the channel length × channel width of the driving TFTs 5005. It is therefore desired that the channel length and the channel width are as large as possible.

When the driving TFT 5005 is to be driven in the saturated region, it is desired to select the channel length to be lager than the channel width, so that $V_{GS}$ is little affected by the threshold voltage. Here, it is desired that the channel length/ channel width is not smaller than 5. Upon increasing the channel length, the characteristics of the driving TFT in the saturated region can be further flattened. If the gate-source voltage $V_{GS}$ is increased too much, however, problems arise concerning the consumption of electric power and breakdown voltage of the driving TFTs. It is therefore desired that the channel length and the channel width are so adjusted that $|V_{GS}|$ is not smaller than 4 V but is not larger than 14 V.

The channel length of the driving TFT 5005 can be increased by being straightened in the vertical direction as represented by the semiconductor layer 5014. The channel length of the driving TFT 5005 can be increased and the channel width can be increased to some extent without decreasing the aperture ratio.

When the aperture ratio is high, the current density for the EL element decreases assuring a long life. Further, since the opening portion is of a simple shape, the effect of shrink decreases.

The switching TFT 5004 is of a double-gate structure in the drawing. The switching TFT 5004, however, may be of a single-gate structure or of a multi-gate structure having three or more gates.

FIG. 2A illustrates an example of a semiconductor layer of a different shape of pattern instead of the semiconductor layer of FIG. 1A. FIG. 2B is a sectional view across α-α' in FIG. 2A. In FIG. 2B, 5111 denotes a substrate, 5112 denotes a base film, 5113 denotes a base film, 5118 denotes a wiring, 5119 denotes a pixel electrode, and 5121 denotes an EL layer. The semiconductor layer may meander in the vertical direction as represented by the driving TFT 5105. With the semiconductor layer being thus formed, the channel length of the driving TFT 5105 can be further increased without decreasing the aperture ratio.

FIG. 3A illustrates an example of-a semiconductor layer of a different shape of pattern instead of the semiconductor layer of FIG. 1A. FIG. 3B is a sectional view across α-α' in FIG. 3A. In FIG. 3B, 5211 denotes a substrate, 5212 denotes a base film, 5213 denotes a base film, 5218 denotes a wiring, 5219 denotes a pixel electrode, and 5221 denotes an EL layer. The semiconductor layer may be formed in a U-shape as represented by the driving TFT 5205. With the semiconductor layer being thus formed, the channel length of the driving TFT 5205 can be further increased and the channel width can be increased to some extent without decreasing the aperture ratio.

Figure 4A:
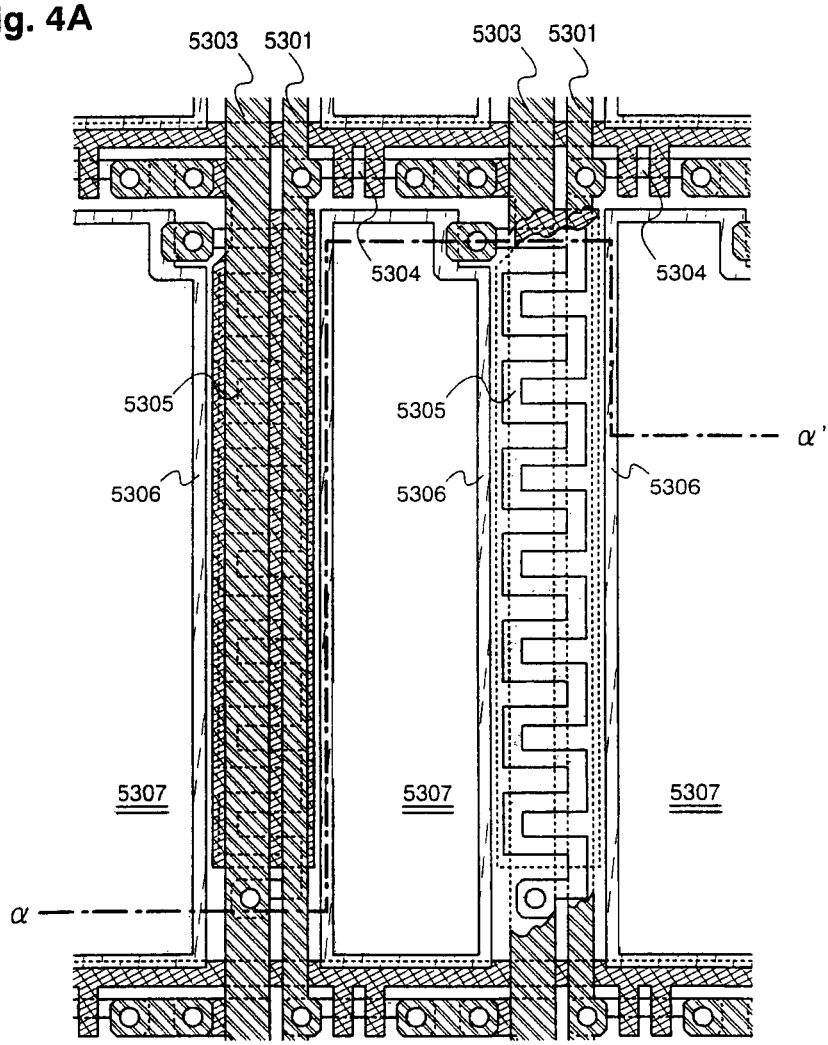
FIGS. 4A and 4B are diagrams illustrating a layout of a pixel portion fabricated according to the invention.
Figure 4B:
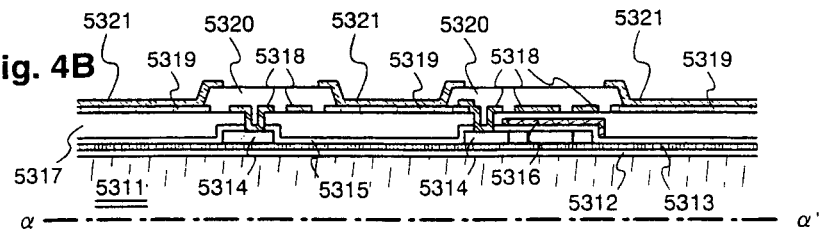

FIG. 4A illustrates an example of a semiconductor layer of a different shape of pattern instead of the semiconductor layer of FIG. 1A. FIG. 4B is a sectional view across α-α' in FIG. 4A. In FIG. 4B, 5311 denotes a substrate, 5312 denotes a base film, 5313 denotes a substrate, 5318 denotes a wiring, 5319 denotes a pixel electrode, and 5321 denotes an EL layer. The semiconductor layer may be formed in a meandering shape in the horizontal direction as represented by the driving TFT 5305. Here, the meandering has a meaning of "flowing in a winding manner", and the meandering shape stands for that the shape of the semiconductor layer is meandering. With the semiconductor layer being thus formed, the channel length of the driving TFT 5305 can be further increased and the channel width can be increased to some extent without decreasing the aperture ratio.

Example 3

The constitution and layout of the 3-transistor type pixels will be described with reference to FIG. 5.

An erasing transistor 5506 for the SES driving is added, the gate electrode of the erasing transistor is connected to a second gate signal line 5503 that inputs an erasing signal to the gate electrode, the source electrode of the erasing transistor is connected to a current supply line 5504, and the drain electrode of the erasing transistor is connected to the drain electrode of a switching TFT 5505 and to the gate electrode of a driving TFT 5507. In FIG. 5B, 5511 denotes a substrate, 5512 denotes a base film, 5513 denotes a substrate, 5518 denotes a wiring, 5519 denotes a pixel electrode, and 5521 denotes an EL layer.

In the case of the 3-transistor type pixels, the two TFTs, namely, the switching TFT 5505 and the erasing TFT 5506 are linearly arranged side by side between the first gate signal line 5502 and the second gate signal line 5503. The drain region of the switching TFT 5505 may be overlapped with the drain region of the erasing TFT 5506. Here, the switching transistor and the erasing transistor are arranged at such positions that a point in the source region and a point in the drain region of the switching TFT 5505, and a point in the source region and a point in the drain region of the erasing TFT 5506, are arranged on a straight line.

This arrangement makes it possible to improve the aperture ratio and to simplify the opening portion.

Figure 5A:
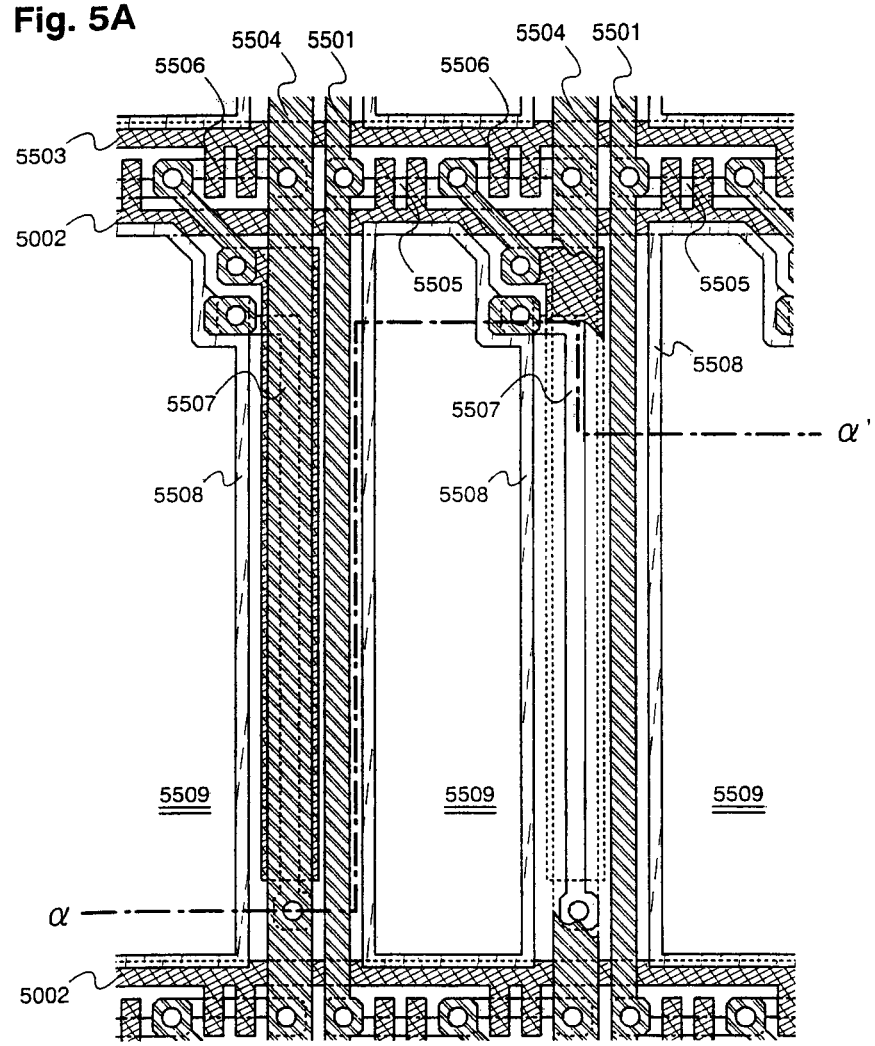
FIGS. 5A and 5B are diagrams illustrating a layout of a pixel portion fabricated according to the invention.
Figure 5B:
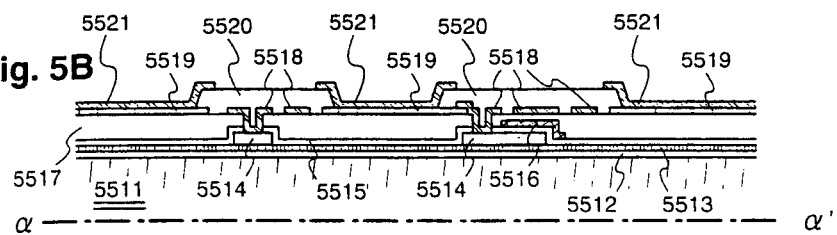
Figure 6A:
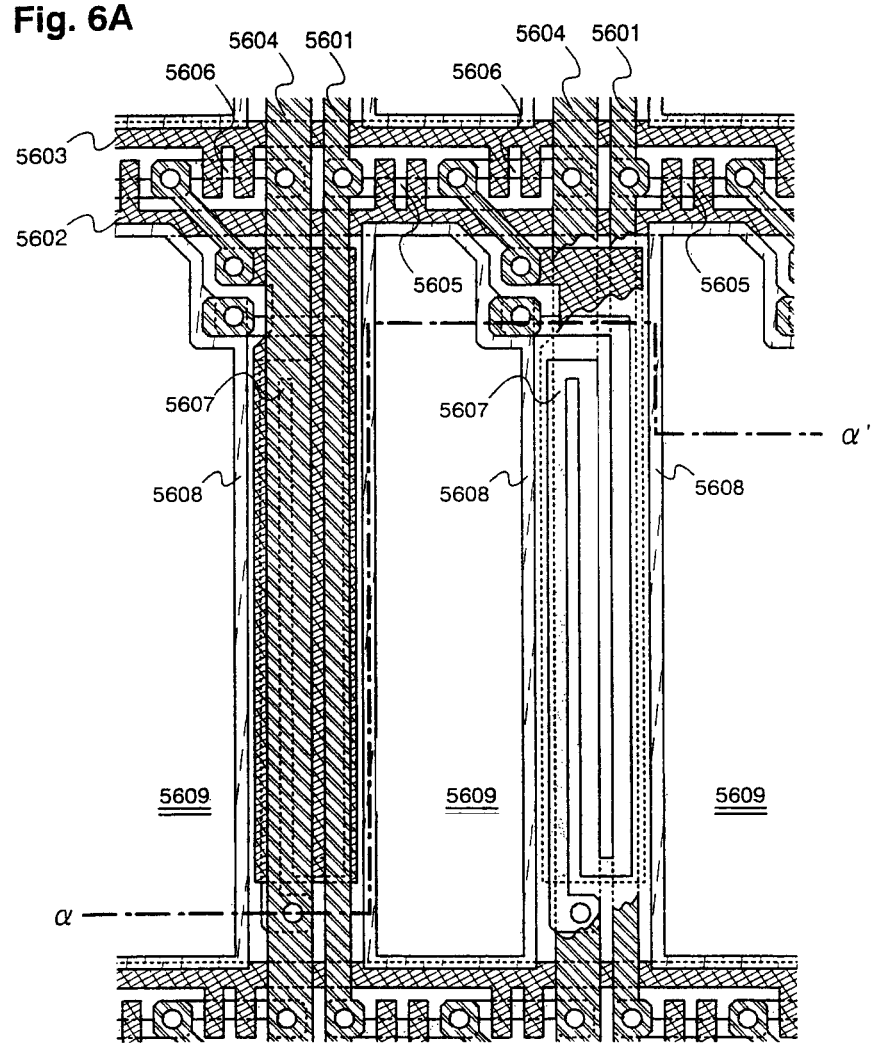
FIGS. 6A and 6B are diagrams illustrating a layout of a pixel portion fabricated according to the invention.
Figure 6B:
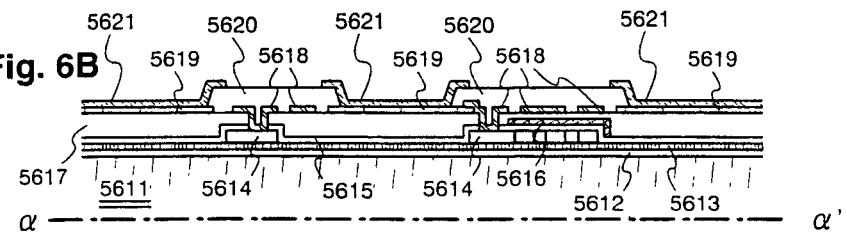

FIG. 6A illustrates an example of a semiconductor layer of a different shape of pattern instead of the semiconductor layer of FIG. 5A. FIG. 6B is a sectional view across α-α' in FIG. 6A. In FIG. 6B, 5611 denotes a substrate, 5612 denotes a base film, 5613 denotes a substrate, 5618 denotes a wiring, 5619 denotes a pixel electrode, and 5621 denotes an EL layer. The semiconductor layer may be formed being meandered in the vertical direction as represented by a driving TFT 5607. With the semiconductor layer being thus formed, the channel length of the driving TFT 5607 can be further increased without decreasing the aperture ratio.

Figure 7A:
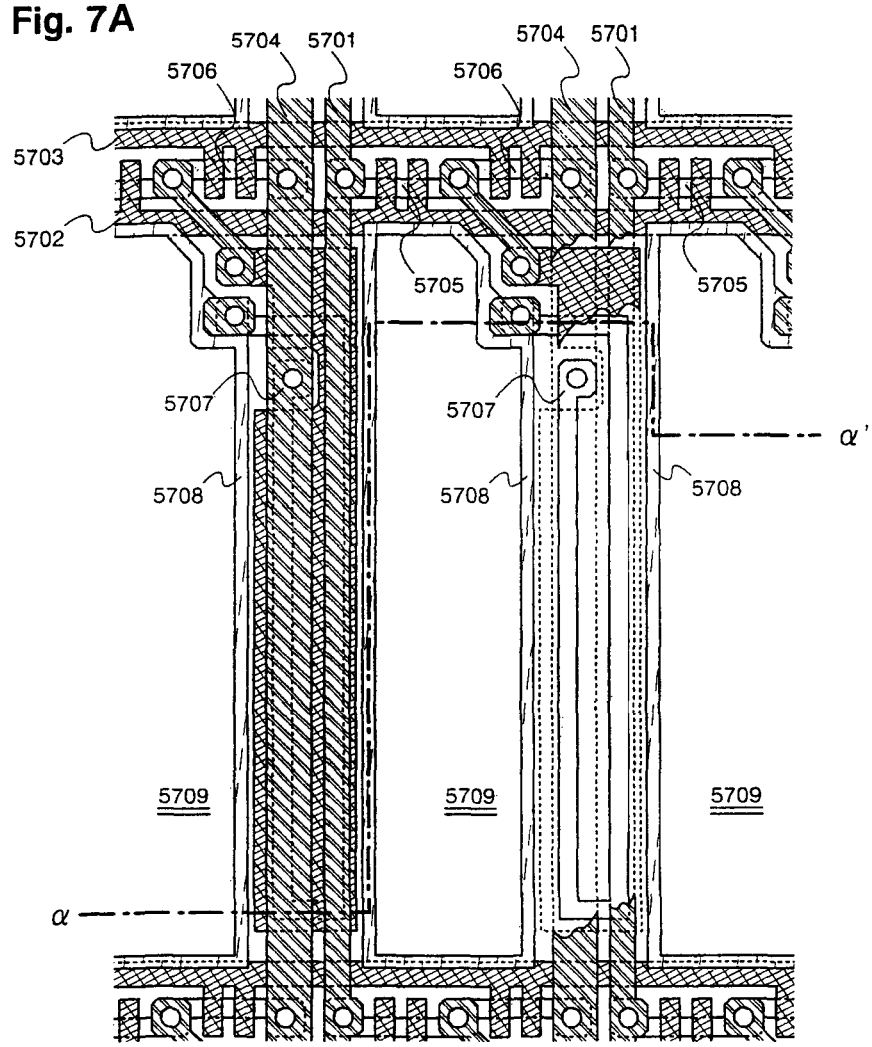
FIGS. 7A and 7B are diagrams illustrating a layout of a pixel portion fabricated according to the invention.
Figure 7B:
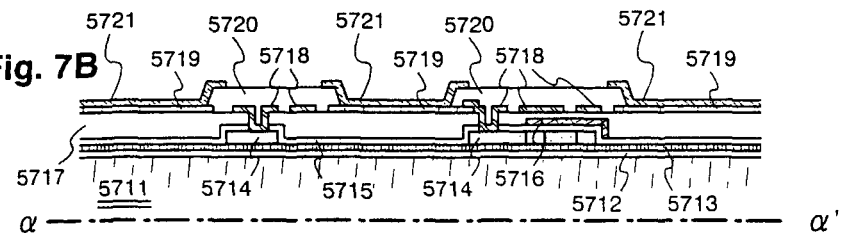

FIG. 7A illustrates an example of a semiconductor layer of a different shape of pattern instead of the semiconductor layer of FIG. 5A. FIG. 7B is a sectional view across α-α' in FIG. 7A. In FIG. 7B, 5711 denotes a substrate, 5712 denotes a base film, 5713 denotes a substrate, 5718 denotes a wiring, 5719 denotes a pixel electrode, and 5721 denotes an EL layer. The semiconductor layer may be formed in a U-shape as represented by a driving TFT 5707. With the semiconductor layer being thus formed, the channel length of the driving TFT 5707 can be further increased and the channel width can be increased to some extent without decreasing the aperture ratio.

FIG. 8A illustrates an example of a semiconductor layer of a different shape of pattern instead of the semiconductor layer of FIG. 5A. FIG. 8B is a sectional view across α-α' in FIG. 8A. In FIG. 8B, 5811 denotes a substrate, 5812 denotes a base film, 5813 denotes a substrate, 5818 denotes a wiring, 5819 denotes a pixel electrode, and 5821 denotes an EL layer. The semiconductor layer may be formed in a meandering shape as represented by a driving TFT 5807. With the semiconductor layer being thus formed, the channel length of the driving TFT 5807 can be further increased and the channel width can be increased to some extent without decreasing the aperture ratio.

Figure 10A:
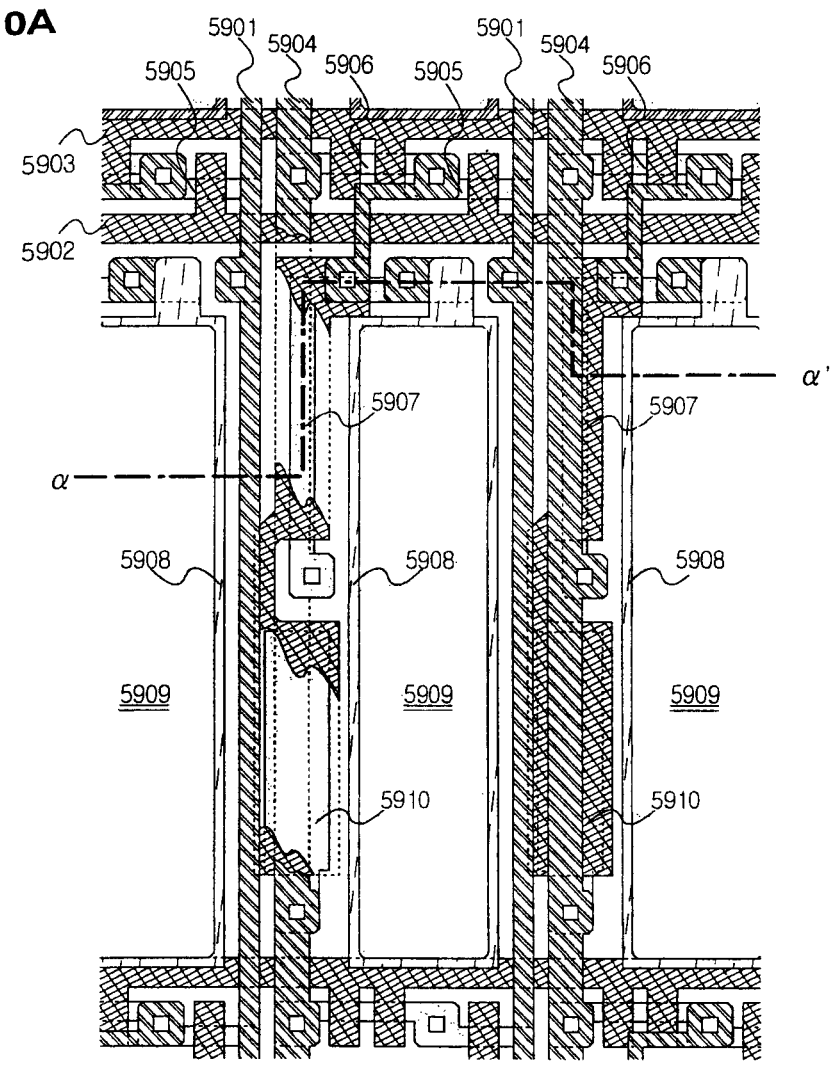
FIGS. 10A and 10B are diagrams illustrating a layout of a pixel portion fabricated according to the invention.
Figure 10B:
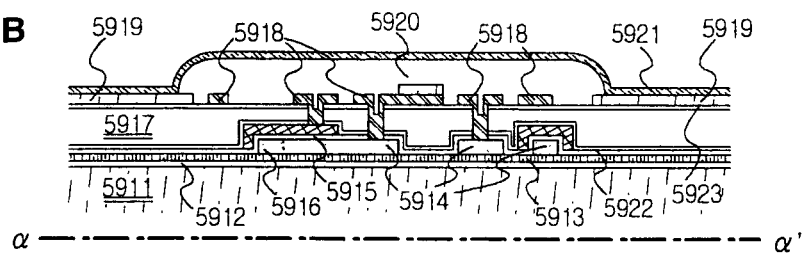

FIG. 10A illustrates an example of a semiconductor layer of a different shape of pattern instead of the semiconductor layer of FIG. 5A. FIG. 10B is a sectional view across α-α' in FIG. 10A. In FIG. 10B, 5911 denotes a substrate, 5912 denotes a base film, 5913 denotes a substrate, 5918 denotes a wiring, 5919 denotes a pixel electrode, and 5921 denotes an EL layer. The semiconductor layer of the driving TFT has a size as designated at 5907. When the holding capacitance is not sufficient relying only upon the gate capacitance of the driving TFT, there may be formed a holding capacitance 5910. Upon forming the holding capacitance 5910 under the partitioning wall 5920, it is possible to obtain a sufficiently large holding capacitance without decreasing the aperture ratio.

In the pixels of the constitutions illustrated in Example 2 and in this Example, the driving TFTs are operated in the saturated regions to control the electric current supplied to the EL elements relying only upon the gate-source voltage of the driving TFTs irrespective of the source-drain voltage of the driving TFTs. In this case, the driving TFTs work as a source of constant current. Therefore, there is no need of integrally forming the current source circuit in the periphery of the pixel portion of the light-emitting device or of adding the current source circuit to the externally provided drive circuit, which contributes to a reduction of the device in the size.

Example 4

Figure 9A:
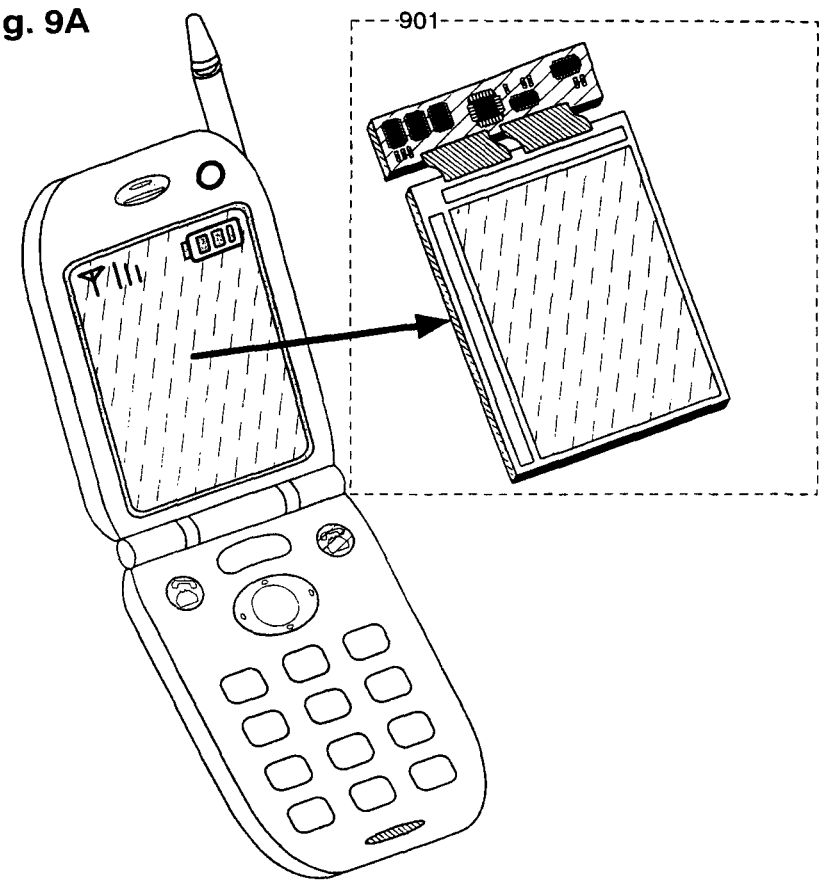
FIGS. 9A and 9B are views illustrating an example in which a light-emitting device and peripheral circuits are used in as a module for an electronic device.

Referring to FIG. 9A, the light-emitting device are built-in as the form of a module 901 when it is incorporated as a display unit of an electronic device such as mobile telephone. Here, the module 901 stands for the one in which the light-emitting device is connected to a board where a signal processing LSI for driving the light-emitting device, a memory and the like are mounted.

Figure 9B:
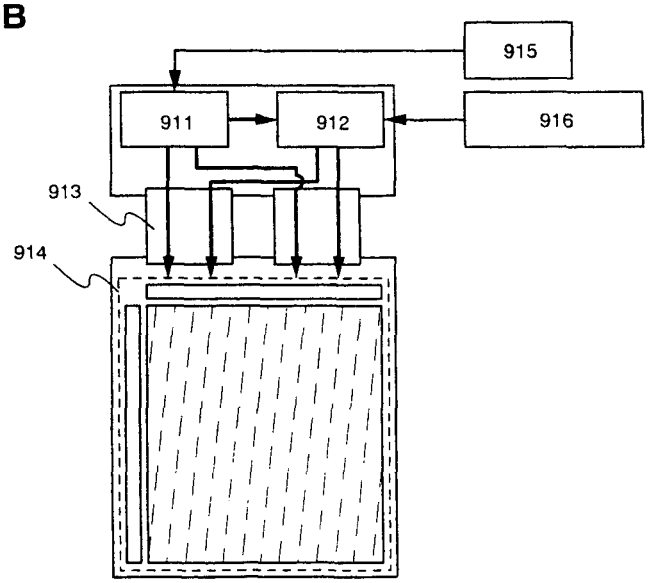

FIG. 9B is a block diagram of the module 901. The module 901 includes a power source unit 911, a signal control unit 912, an FPC 913 and a light-emitting device 914. Being powered by an external battery, the power source unit 911 forms a plurality of desired voltages and supplies them with the source signal line drive circuit, the gate signal line drive circuit, the light-emitting elements and the like. The signal control unit 912 receives video signals and synchronizing signals, converts them into various signals so as to be processed by the light-emitting device 901, and forms clock signals and the like for driving the source signal line drive circuit and the gate signal line drive circuit.

The module 901 of this embodiment includes the light-emitting device 914, the power source unit 911 and the signal control unit 912, which are independently formed. They, however, may be formed integrally together on a substrate.

Figure 11A:
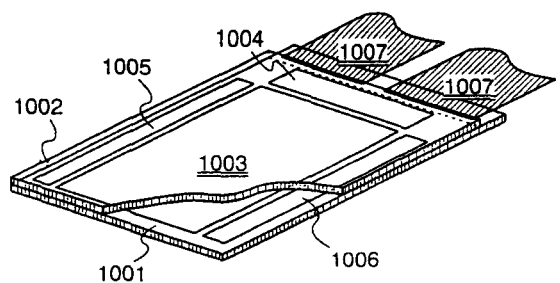
FIGS. 11A and 11B are diagrams illustrating configurations of a light emitting device in the invention.

FIG. 11 illustrates, in detail, the constitution of the light-emitting device 914 included in the module 901 shown in FIG. 9.

The light-emitting device is, on the board 1001, constituted by a pixel portion 1003, a source signal line drive circuit 1004, gate signal line drive circuits 1005 and 1006, an FPC 1007 and the like. The opposing board 1002 may be made of a transparent material such as glass or a metallic material. A gap between the board 1001 and the opposing board 1002 is sealed with a filler, and is often filled with a drying agent to prevent the EL elements from being deteriorated with water.

Figure 11B:
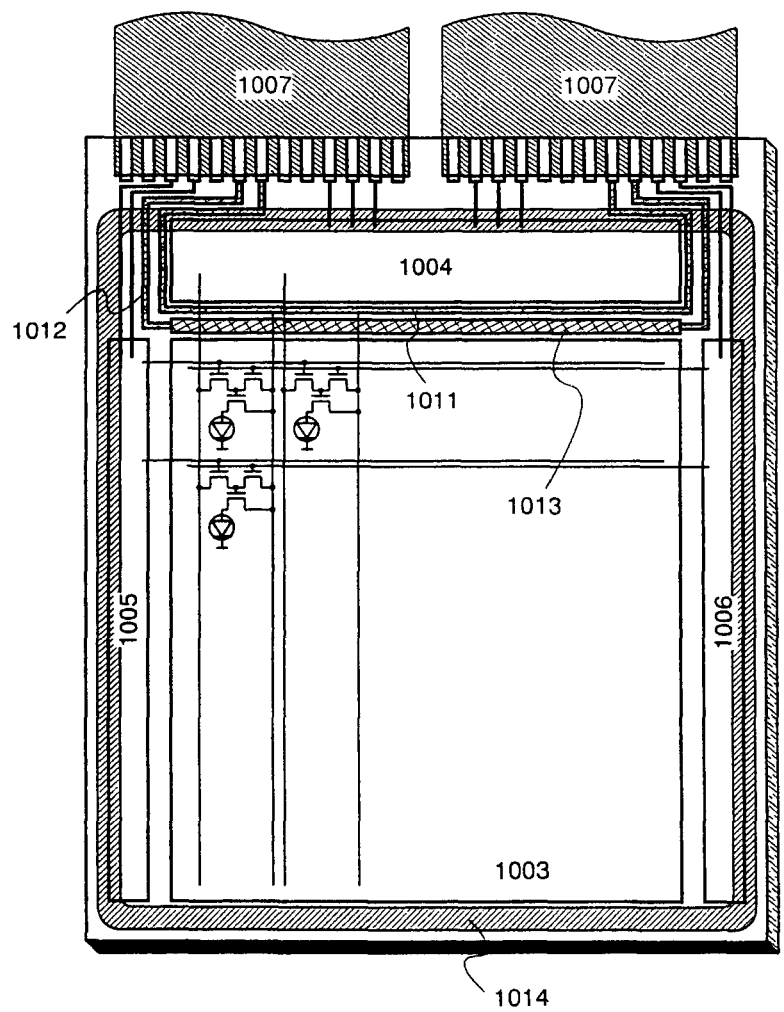

FIG. 11B is a top view. A pixel portion 1003 is arranged on the central portion of the substrate. On the peripheries, there are arranged the source signal line drive circuit 1004, and the gate signal line drive circuits 1005 and 1006. On the peripheries of the source signal line drive circuit 1004, there are arranged a current supply line 1011 and an opposing electrode contact 1013 and the like. The opposing electrodes of the EL elements are formed on the whole surface of the pixel portion, and an opposing potential is applied from the opposing electrode contact 1013 through the FPC 1007. Signals for driving the source signal line drive circuit 1004 and the gate signal line drive circuits 1005, 1006, as well as the power source, are fed from external units through the FPC 1007.

A sealing member 1014 for sticking the substrate 1001 and the opposing substrate 1002 may be so formed as to be partly overlapped with the source signal line drive circuit 1004 and on the gate signal line drive circuits 1005, 1006 as shown in FIG. 11B. Then, the frame of the light-emitting device can be narrowed.

Example 5

In Example 5, an example of manufacturing a light-emitting device by using the present invention is described with reference to FIGS. 19A to 19C.

Figure 19A:
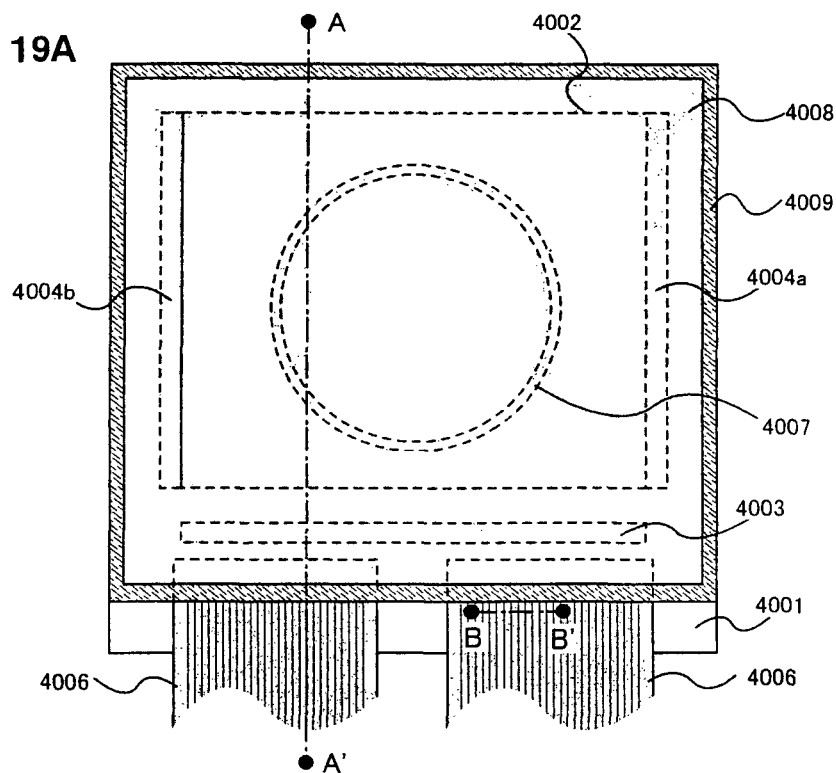
FIGS. 19A to 19C include a top view and sectional views of a light-emitting device.
Figure 19B:
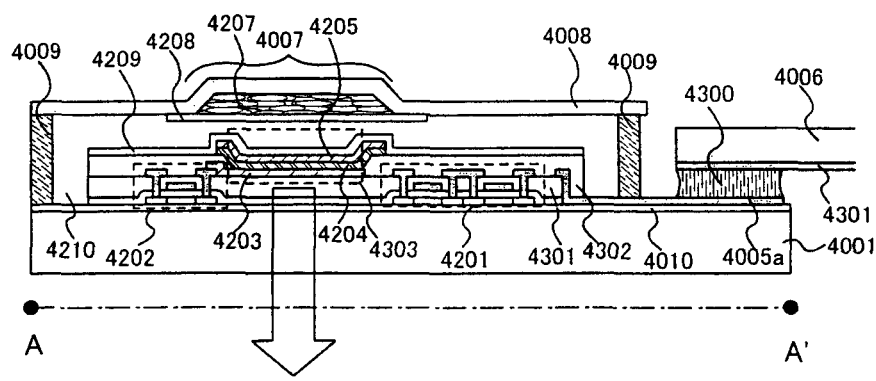

FIG. 19A is a top view of a light-emitting device formed by sealing a transistor substrate on which a pixel portion is provided by means of a sealing material. FIG. 19B is a cross sectional view taken along a line A-A' of FIG. 19A, and FIG. 19C is a sectional view taken along a line B-B' of FIG. 19A.

A seal member 4009 is provided so as to surround a pixel portion 4002, a source signal line driving circuit 4003, and the first and the second gate signal line driving circuits 4004a and 4004b, which are provided on a substrate 4001. Further, a sealing member 4008 is provided over the pixel portion 4002, the source signal line driving circuit 4003, and the first and the second gate signal line driving circuits 4004a and 4004b. Thus, the pixel portion 4002, the source signal line driving circuit 4003, and the first and the second gate signal line driving circuits 4004a and 4004b are sealed with a filler 4210 and by the substrate 4001, the seal member 4009, and the sealing member 4008. The seal member 4009 may be provided to overlap with a portion of the source signal line driving circuit 4003 and the first and the second gate signal line driving circuits 4004a and 4004b.

Further, the pixel portion 4002, the source signal line driving circuit 4003, the first and the second gate signal line driver circuits 4004a and 4004b provided on the substrate 4001 include a plurality of TFTs. FIG. 19B typically shows TFTs (here, an n-channel TFT and a p-channel TFT are shown) 4201 included in the source signal line driving circuit 4003 and a TFT 4202 included in the pixel portion 4002.

An interlayer insulating film (flattening film) 4301 is formed on the driving TFTs 4201 and 4202, and a pixel electrode (anode) 4203 electrically connected to a drain region of the TFT 4202 is formed thereon. A transparent conductive film having a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4302 is formed on the pixel electrode 4203, and an opening portion is formed in the insulating film 4302 over the pixel electrode 4203. In this opening portion, an organic light-emitting layer 4204 is formed on the pixel electrode 4203. The organic light-emitting layer 4204 is formed by using a known organic light-emitting material or inorganic light-emitting material. Although the organic light-emitting material includes a low molecular system (monomer system) and a high molecular system (polymer system), either may be used.

The organic light-emitting layer 4204 is formed by using a known evaporation technique or coating technique. The organic light-emitting layer may be formed to be a lamination structure composing a hole injecting layer, a hole transporting layer, a light-emitting layer, an electron transporting layer, and an electron injecting layer or to be a single structure.

A cathode 4205 made of a conductive film (typically, a conductive film containing aluminum, copper or silver as its main ingredient, or a laminate film of those and another conductive films) having a light shielding property is formed on the organic light-emitting layer 4204. It is desirable that moisture and oxygen existing on the interface between the cathode 4205 and the organic light-emitting layer 4204 are removed to the utmost. Accordingly, it is necessary to make such contrivance that the organic light-emitting layer 4204 is formed in a nitrogen or rare gas atmosphere, and the cathode 4205 is formed while the light-emitting layer is not exposed to oxygen or moisture. In this example, a multi-chamber system (cluster tool system) film forming apparatus is used, so that the film formation as described above is enabled. A predetermined voltage is applied to the cathode 4205.

In the manner as described above, an light-emitting element 4303 constituted by the pixel electrode (anode) 4203, the organic light-emitting layer 4204, and the cathode 4205 is formed. Then, a protection film 4209 is formed on the insulating film 4302 so as to cover the light-emitting element 4303. The protection film 4209 is effective to prevent oxygen, moisture and the like from penetrating into the light-emitting element 4303.

Reference numeral 4005a designates a drawing wiring line connected to a power supply line and is electrically connected to a source region of the second TFT 4202. The drawing wiring line 4005a passes between the seal member 4009 and the substrate 4001, and is electrically connected to an FPC wiring line 4301 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case where the radiation direction of light from the light-emitting element is directed toward the side of a cover member, the cover member must be transparent. In this case, a transparent material such as a glass plate, a plastic plate, a polyester film, or an acryl film is used.

As the filler 4103, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this example, nitrogen was used as the filler.

Further, in order to expose the filler 4103 to a hygroscopic material (preferably, barium oxide) or a material capable of adsorbing oxygen, a recess portion 4007 is provided on the surface of the sealing member 4008 on the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the light-emitting element 4303 can be suppressed by providing therewith the hygroscopic material or the material 4207 capable of adsorbing oxygen.

Figure 19C:
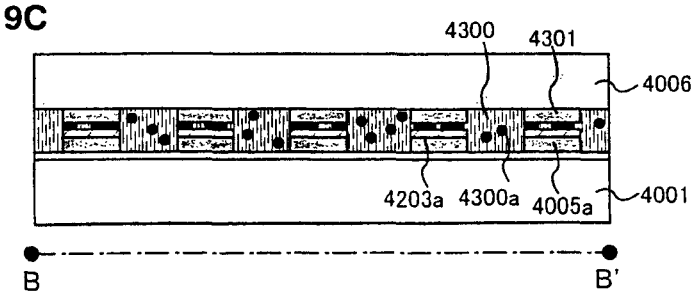
Figure 20:
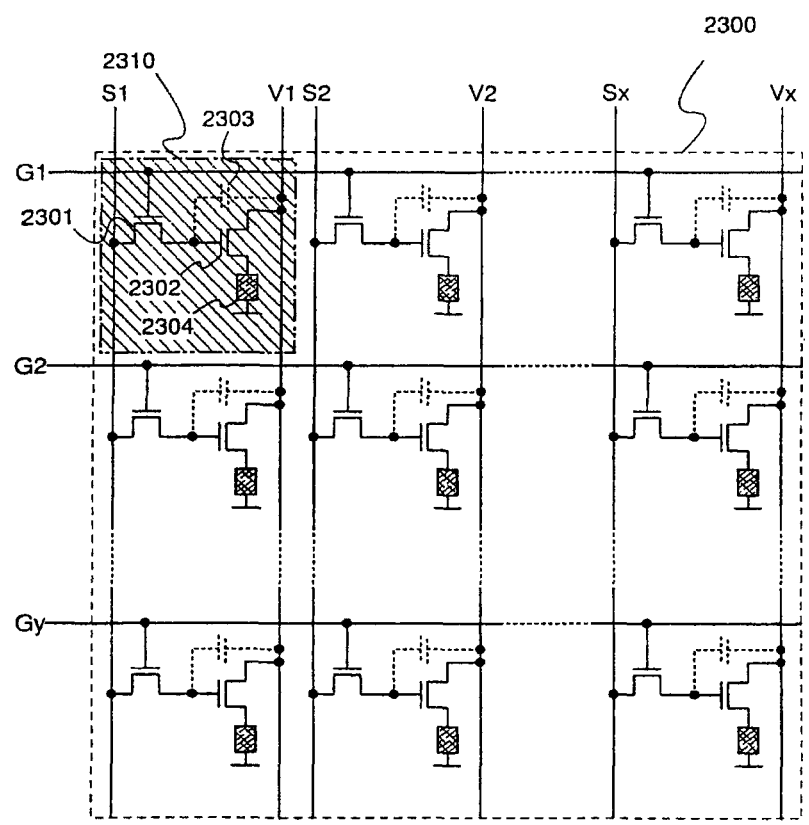
FIG. 20 is a diagram illustrating a matrix of 2-transistor type pixels.

As shown in FIG. 19C, at the same time as the formation of the pixel electrode 4203, a conductive film 4203a is formed to be in contact with the drawing wiring line 4005a.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

Example 6

In Example 6, manufacturing steps of the light-emitting device shown in Examples 2 and 3 are described with reference to FIGS. 22A to 22D. Though the description of a pixel portion is only given here, manufacturing steps of a driving circuit is not limited to this so that the description thereof is omitted here.

As shown in FIG. 22A, a base film (not shown) made of a silicon oxide film, a silicon nitride film, or a silicon oxynitride film is formed on a substrate made of glass such as barium borosilicate glass or aluminoborosilicate glass. Thereafter an amorphous semiconductor layer is crystallized by using a laser crystallization method and a known thermal crystallization method. Then the crystallized semiconductor layer is patterned in a desired shape to obtain semiconductor islands 2201 and 2202 (FIG. 22A).

A gate insulating film (not shown) to cover the semiconductor islands 2201 and 2202 is formed. Conductive films to form the gate electrode may be made of an element selected from the group consisting of Ta, W, Ti, Mo, Al, Cu, or an alloy material containing mainly the above elements, or a compound material containing mainly the above elements. Thereafter patterning is subjected into a desired shape to obtain gate electrodes 2203 and 2204 (reference numeral 2203 serves both as the gate electrode and the gate signal line) (FIG. 22B).

An insulating film (not shown) functioning additionally as planarization of the substrate surface and a pixel electrode 2205 is formed thereon. In the pixel electrode 2205, in the case that the display surface is an upper side, the electrode is a reflective electrode, in the case that the display surface is on lower side, the electrode is a transparent electrode having a transparency to the light. MgAg and the like may be used as materials for forming the reflective electrode, and ITO and the like may be used as materials for forming the transparent electrode typically. The pixel electrode 2205 is formed into a desired shape by patterning after a film is made of the above materials.

A contact hole 2206 reaching to the semiconductor layers 2201, 2202, and the gate electrode 2204 is opened to form wirings 2207 to 2209 (reference numeral 2207 is to be a source signal line and 2208 is to be a current supply line). The wiring 2209 and the pixel electrode 2206 are made contact by being overlapped with each other (FIG. 22C).

Next, a partitioning wall is formed between the adjoining pixels and open the portion to be a light-emitting area 2210 by etching (FIG. 22D). Thereafter, an EL layer is formed on the opening portion, and thus the pixel portion is completed.

Example 7

The light-emitting device is of the self-emission type, and thus exhibits more excellent recognizability of the displayed image in a light place and has a wider viewing angle as compared to the liquid crystal display device. Accordingly, the light-emitting device can be applied to a display portion in various electronic devices.

Such electronic devices using a light-emitting device of the present invention include a video camera, a digital camera, a goggles-type display (head mount display), a navigation system, a sound reproduction device (such as a car audio equipment and an audio set), a lap-top computer, a game machine, a portable information terminal (such as a mobile computer, a mobile telephone, a portable game machine, and an electronic book), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIGS. 21A to 21H respectively shows various specific examples of such electronic devices.

Figure 21A:
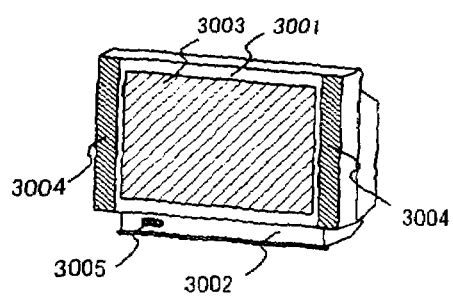
FIGS. 21A to 21H are views illustrating examples of electronic devices to which the invention can be applied.

FIG. 21A illustrates an electro-luminescence display device which includes a casing 3001, a support table 3002, a display portion 3003, a speaker portion 3004, a video input terminal 3005 and the like. The present invention is applicable to the display portion 3003. The light-emitting device is of the self-emission-type and therefore requires no backlight. Thus, the display portion thereof can have a thickness thinner than that of the liquid crystal display device. The light-emitting device is including the entire display device for displaying information, such as a personal computer, a receiver of TV broadcasting and an advertising display.

Figure 21B:
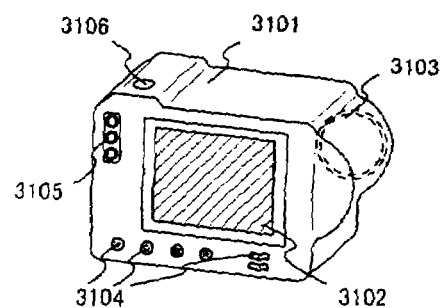

FIG. 21B illustrated a digital still camera which includes a main body 3101, a display portion 3102, an image receiving portion 3103, an operation key 3104, an external connection port 3105, a shutter 3106, and the like. The light-emitting device of the present invention can be used as the display portion 3102.

Figure 21C:
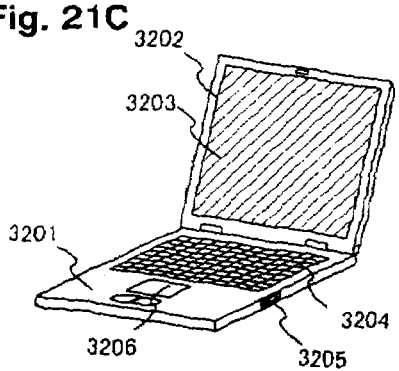

FIG. 21C illustrates a lap-top computer which includes a main body 3201, a casing 3202, a display portion 3203, a keyboard 3204, an external connection port 3205, a pointing mouse 3206, and the like. The light-emitting device of the present invention can be used as the display portion 3203.

Figure 21D:
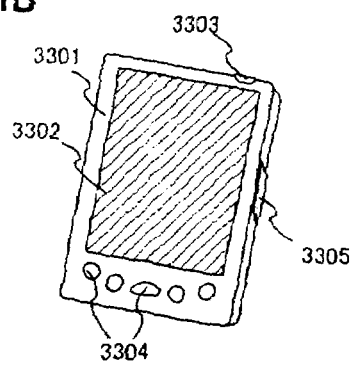

FIG. 21D illustrated a mobile computer which includes a main body 3301, a display portion 3302, a switch 3303, an operation key 3304, an infrared port 3305, and the like. The light-emitting device of the present invention can be used as the display portion 3302.

Figure 21E:
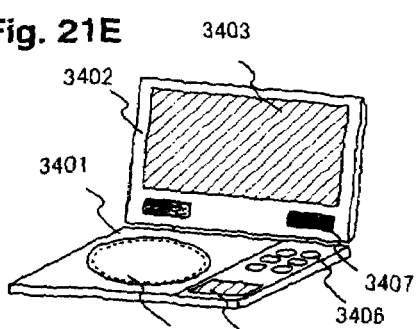

FIG. 21E illustrates a portable image reproduction equipment including a recording medium (more specifically, a DVD reproduction apparatus), which includes a main body 3401, a casing 3402, a display portion A 3403, another display portion B 3404, a-recording medium (DVD or the like) reading portion 3405, an operation key 3406, a speaker portion 3407 and the like. The display portion A 3403 is used mainly for displaying image information, while the display portion B 3404 is used mainly for displaying character information. The light-emitting device of the present invention can be used as these display portions A 3403 and B 3404. The image reproduction apparatus including a recording medium further includes a domestic game machine or the like.

Figure 21F:
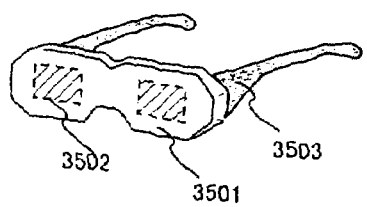

FIG. 21F illustrates a goggle type display (head mounted display) which includes a main body 3501, a display portion 3502, arm portion 3503, and the like. The light-emitting device of the present invention can be used as the display portion 3502.

Figure 21G:
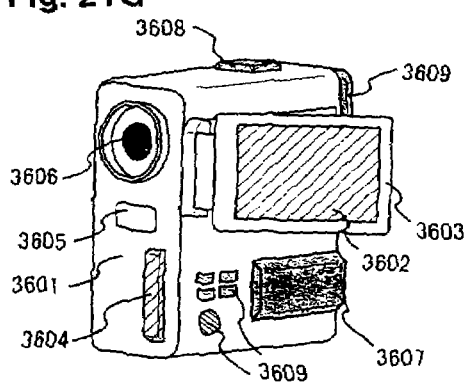

FIG. 21G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, and the like. The light-emitting device of the present invention can be used as the display portion 3602.

Figure 21H:
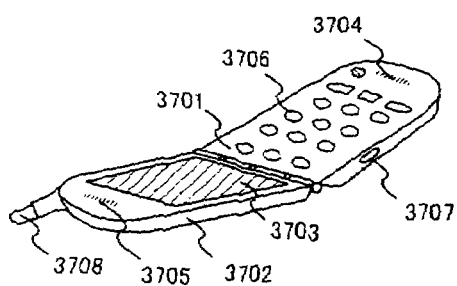

FIG. 21H illustrates a mobile telephone which includes a main body 3701, a casing 3702, a display portion 3703, a sound input portion 3704, a sound output portion 3705, an operation key 3706, an external connecting port 3707, an antenna 3708, and the like. The light-emitting device of the present invention can be used as the display portion 3703. Note that the display portion 3703 can reduce power consumption of the mobile telephone by displaying white-colored characters on a black-colored background.

When the brighter luminance of light emitted from the organic light-emitting material becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic light-emitting material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the present invention can be applied variously-to a wide range of electronic devices in all fields. Moreover, the electronic device in this example can be implemented by using any structure of the light-emitting devices in Examples 1 to 6.

According to the invention as described above, the size of the driving TFT is increased and the channel length L is increased relative to the channel width W, making it possible to use the TFTs having excellently homogeneous current characteristics in the saturated region as the driving TFTs for the pixels and preventing the brightness of the EL elements from being affected by the variation of the driving TFTs. Further, the holding capacitor is created by the channel capacitance of the driving TFT and is arranged at a position where it is overlapped with the partitioning wall outside the light-emitting area. Therefore, a high aperture ratio can be expected.

What is claimed is:

1. A light-emitting device comprising:
   a first transistor comprising a semiconductor layer and a gate electrode;
   a capacitor comprising a first electrode;
   an insulating film over the first transistor and the capacitor;
   a source signal line over the insulating film;
   a current supply line over the insulating film;
   a first light-emitting element comprising a first pixel electrode over the insulating film; and
   a second light-emitting element comprising a second pixel electrode over the insulating film;
   wherein a first terminal of the first transistor is electrically connected to the current supply line,
   wherein a second terminal of the first transistor is electrically connected to the first pixel electrode,
   wherein the gate electrode and the first electrode are a same layer, and
   wherein the current supply line overlaps the semiconductor layer, the gate electrode, and the first electrode.

2. A light-emitting device according to claim 1, wherein the source signal line overlaps the first transistor.

3. A light-emitting device according to claim 1,
   wherein the semiconductor layer has a channel length L and a channel width W, and
   wherein $L \times W > 200 \ \mu m^2$.

4. A light-emitting device according to claim 1,
wherein a gate-source voltage of the first transistor is $V_{GS}$, a source-drain voltage of the first transistor is $V_{DS}$ and a threshold voltage of the first transistor is $V_{th}$, and
wherein the first transistor is driven so that $|V_{DS}|<|V_{GS}|-|V_{th}|$ is satisfied.

5. A light-emitting device according to claim 1,
wherein a gate-source voltage of the first transistor is $V_{GS}$, a source-drain voltage of the first transistor is $V_{DS}$ and a threshold voltage of the first transistor is $V_{th}$, and
wherein the first transistor is driven so that $|V_{DS}|\geq|V_{GS}|-|V_{th}|$ is satisfied and $|V_{GS}|$ is not lower than 4 V but is not higher than 14 V.

6. A light-emitting device according to claim 1,
wherein the semiconductor layer has a channel length L and a channel width W, and
wherein L >5W.

7. A light-emitting device according to claim 1, further comprising:
a third light-emitting element;
a second transistor electrically connected to the second light-emitting element;
a third transistor electrically connected to the third light-emitting element,
wherein the first light-emitting element emits red light,
wherein the second light-emitting element emits green light, and
wherein the third light-emitting element emits blue light,
wherein each of the first to third transistors has a channel length L and a channel width W, and
wherein L/W of the first transistor, L/W of the second transistor and L/W of the third transistor are different from each other.

8. A light-emitting device according to claim 1, further comprising:
a second transistor electrically connected to the first transistor; and
a third transistor electrically connected to the first transistor, the second transistor and the current supply line.

9. A light-emitting device according to claim 8, wherein the second transistor and the third transistor are arranged so that a point in a source region of the second transistor, a point in a drain region of the second transistor, a point in a source region of the third transistor and a point in a drain region of the third transistor are located on a straight line.

10. An electronic device using a light-emitting device according to claim 1,
wherein the electronic device is selected from the group consisting of electro-luminescence display device, a digital still camera, a lap-top computer, a mobile computer, a portable image reproduction equipment including a recording medium, a goggle type display, a video camera and a mobile telephone.

11. A light-emitting device comprising:
a first transistor comprising a semiconductor layer and a gate electrode;
a capacitor comprising a first electrode;
an insulating film over the first transistor and the capacitor;
a source signal line over the insulating film;
a current supply line over the insulating film;
a first light-emitting element comprising a first pixel electrode over the insulating film; and
a second light-emitting element comprising a second pixel electrode over the insulating film;
wherein a first terminal of the first transistor is electrically connected to the current supply line,
wherein a second terminal of the first transistor is electrically connected to the first pixel electrode,
wherein the gate electrode and the first electrode are a same layer, and
wherein the current supply line overlaps the first transistor and a part of the first electrode.

12. A light-emitting device according to claim 11,
wherein the semiconductor layer has a channel length L and a channel width W, and
wherein L×W>200 µm².

13. A light-emitting device according to claim 11,
wherein a gate-source voltage of the first transistor is $V_{GS}$, a source-drain voltage of the first transistor is $V_{DS}$ and a threshold voltage of the first transistor is $V_{th}$, and
wherein the first transistor is driven so that $|V_{DS}|<|V_{GS}|-|V_{th}|$ is satisfied.

14. A light-emitting device according to claim 11,
wherein a gate-source voltage of the first transistor is $V_{GS}$, a source-drain voltage of the first transistor is $V_{DS}$ and a threshold voltage of the first transistor is $V_{th}$, and
wherein the first transistor is driven so that $|V_{DS}|\geq|V_{GS}|-|V_{th}|$ is satisfied and $|V_{GS}|$ is not lower than 4 V but is not higher than 14 V.

15. A light-emitting device according to claim 11,
wherein the semiconductor layer has a channel length L and a channel width W, and
wherein L >5W.

16. A light-emitting device according to claim 11, further comprising:
a third light-emitting element;
a second transistor electrically connected to the second light-emitting element;
a third transistor electrically connected to the third light-emitting element,
wherein the first light-emitting element emits red light,
wherein the second light-emitting element emits green light, and
wherein the third light-emitting element emits blue light,
wherein each of the first to third transistors has a channel length L and a channel width W, and
wherein L/W of the first transistor, L/W of the second transistor and L/W of the third transistor are different from each other.

17. A light-emitting device according to claim 11, further comprising:
a second transistor electrically connected to the first transistor; and
a third transistor electrically connected to the first transistor, the second transistor and the current supply line.

18. A light-emitting device according to claim 17, wherein the second transistor and the third transistor are arranged so that a point in a source region of the second transistor, a point in a drain region of the second transistor, a point in a source region of the third transistor and a point in a drain region of the third transistor are located on a straight line.

19. An electronic device using a light-emitting device according to claim 11,
wherein the electronic device is selected from the group consisting of electro-luminescence display device, a digital still camera, a lap-top computer, a mobile computer, a portable image reproduction equipment including a recording medium, a goggle type display, a video camera and a mobile telephone.

* * * * *

UNITED STATES PATENT AND TRADEMARK OFFICE
CERTIFICATE OF CORRECTION

PATENT NO. : 8,723,760 B2  
APPLICATION NO. : 11/832307  
DATED : May 13, 2014  
INVENTOR(S) : Mitsuaki Osame et al.

Page 1 of 1

It is certified that error appears in the above-identified patent and that said Letters Patent is hereby corrected as shown below:

In the Specification

Column 2, line 40, after "60Hz)" insert --.--;

Column 3, line 20, replace "AID" with --$\Delta I_D$--;

Column 3, line 32, replace "-operation" with --operation--;

Column 4, line 5, before "=" replace "CS" with --Cs--;

Column 4, line 6, replace "66 t" with --$\Delta t$--;

Column 6, line 31, replace "$|V_{DS}| \geq |V_{GS}| - V_{th}|$" with --$|V_{DS}| \geq |V_{GS}| - |V_{th}|$--;

In the Claims

Column 19, lines 11-12, in claim 5 replace "$|V_{Ds}| \geq |V_{Gs}| - |V_{th}|$ is satisfied and $|V_{Gs}|$" with --$|V_{DS}| \geq |V_{GS}| - |V_{th}|$ is satisfied and $|V_{GS}|$--.

Signed and Sealed this  
Twenty-sixth Day of August, 2014

Michelle K. Lee  
*Deputy Director of the United States Patent and Trademark Office*

UNITED STATES PATENT AND TRADEMARK OFFICE
CERTIFICATE OF CORRECTION

PATENT NO.        : 8,723,760 B2                         Page 1 of 1
APPLICATION NO.   : 11/832307
DATED             : May 13, 2014
INVENTOR(S)       : Mitsuaki Osame et al.

It is certified that error appears in the above-identified patent and that said Letters Patent is hereby corrected as shown below:

In the Claims

Column 19, lines 5-6, in claim 4 replace "$|V_{Ds}| < |V_{Gs}| - |V_{th}|$" with --$|V_{DS}| < |V_{GS}| - |V_{th}|$--.

Signed and Sealed this
Ninth Day of December, 2014

Michelle K. Lee
*Deputy Director of the United States Patent and Trademark Office*